US011061646B2

(12) United States Patent
Sumbul et al.

(10) Patent No.: US 11,061,646 B2
(45) Date of Patent: Jul. 13, 2021

(54) COMPUTE IN MEMORY CIRCUITS WITH MULTI-VDD ARRAYS AND/OR ANALOG MULTIPLIERS

(71) Applicant: Intel Corporation, Santa Clara, CA (US)

(72) Inventors: Huseyin Ekin Sumbul, Portland, OR (US); Phil Knag, Hillsboro, OR (US); Gregory K. Chen, Portland, OR (US); Raghavan Kumar, Hillsboro, OR (US); Abhishek Sharma, Hillsboro, OR (US); Sasikanth Manipatruni, Portland, OR (US); Amrita Mathuriya, Portland, OR (US); Ram Krishnamurthy, Portland, OR (US); Ian A. Young, Portland, OR (US)

(73) Assignee: Intel Corporation, Santa Clara, CA (US)

(*) Notice: Subject to any disclaimer, the term of this patent is extended or adjusted under 35 U.S.C. 154(b) by 337 days.

(21) Appl. No.: 16/147,004

(22) Filed: Sep. 28, 2018

(65) Prior Publication Data

US 2019/0042199 A1  Feb. 7, 2019

(51) Int. Cl.
*G06F 7/544* (2006.01)
*G11C 8/10* (2006.01)
(Continued)

(52) U.S. Cl.
CPC ............. *G06F 7/5443* (2013.01); *G06G 7/16* (2013.01); *G11C 7/1006* (2013.01); *G11C 7/12* (2013.01);
(Continued)

(58) Field of Classification Search
CPC ......... G06F 17/16; G06F 7/5443; G06G 7/12; G06G 7/14; G06G 7/16–161;
(Continued)

(56) References Cited

U.S. PATENT DOCUMENTS 5,619,447 A    4/1997  Tai
10,496,855 B2 * 12/2019  Muralimanohar .... G06F 7/5443
(Continued)

OTHER PUBLICATIONS

"Analog Multipliers," Analog Devices MT-079 Tutorial, 8 pages.
(Continued)

*Primary Examiner* — Matthew D Sandifer
(74) *Attorney, Agent, or Firm* — Compass IP Law, PC

(57) ABSTRACT

Compute-in memory circuits and techniques are described. In one example, a memory device includes an array of memory cells, the array including multiple sub-arrays. Each of the sub-arrays receives a different voltage. The memory device also includes capacitors coupled with conductive access lines of each of the multiple sub-arrays and circuitry coupled with the capacitors, to share charge between the capacitors in response to a signal. In one example, computing device, such as a machine learning accelerator, includes a first memory array and a second memory array. The computing device also includes an analog processor circuit coupled with the first and second memory arrays to receive first analog input voltages from the first memory array and second analog input voltages from the second memory array and perform one or more operations on the first and second analog input voltages, and output an analog output voltage.

26 Claims, 16 Drawing Sheets

(51) Int. Cl.
G11C 8/08 (2006.01)
G11C 7/12 (2006.01)
G11C 11/4094 (2006.01)
G11C 7/10 (2006.01)
G11C 11/56 (2006.01)
G11C 11/4091 (2006.01)
G06G 7/16 (2006.01)
G11C 11/419 (2006.01)

(52) U.S. Cl.
CPC ............... *G11C 8/08* (2013.01); *G11C 8/10* (2013.01); *G11C 11/4091* (2013.01); *G11C 11/4094* (2013.01); *G11C 11/56* (2013.01); *G11C 11/419* (2013.01)

(58) Field of Classification Search
CPC ..... G11C 7/1006; G11C 7/12; G11C 11/4091; G11C 11/4094; G11C 11/4096; G11C 8/08; G06N 3/0635
See application file for complete search history.

(56) References Cited

U.S. PATENT DOCUMENTS

| | | | |
|---|---|---|---|
| 2003/0021152 A1 | 1/2003 | Le et al. | |
| 2007/0153612 A1* | 7/2007 | Lee | G11C 5/145 365/226 |
| 2012/0008445 A1* | 1/2012 | Parris | G11C 11/4094 365/203 |
| 2012/0016502 A1 | 1/2012 | Sharma et al. | |
| 2014/0172937 A1* | 6/2014 | Linderman | G06N 3/0445 708/607 |
| 2014/0233336 A1* | 8/2014 | Shin | G11C 7/12 365/205 |
| 2017/0228345 A1* | 8/2017 | Gupta | G06F 17/16 |
| 2017/0264191 A1 | 9/2017 | Seo | |
| 2018/0095748 A1 | 4/2018 | Buchanan et al. | |
| 2018/0114569 A1 | 4/2018 | Strachan et al. | |

OTHER PUBLICATIONS

Allen, "Lecture 110—Phase Frequency Detectors," ECE 6440-Frequency Synthesizers, Jun. 9, 2003, 18 pages.
Ambrogio, S., et al., "Equivalent-Accuracy Accelerated Neural-Network Training Using Analogue Memory," Nature, vol. 558, Jun. 7, 2018, 22 pages.
Biswas, A., et al., "A 42pJ/decision 3.12TOPS/W Robust In-Memory Machine Learning Classifier With On-Chip Training," 2018 IEEE International Solid—State Circuits Conference—(ISSCC), San Francisco, CA, 2018, pp. 488-490.
Fick, D., et al., "Analog Computation in Flash Memory for Datacenter-Scale AI Inference in a Small Chip", 2.05 Mythic Hot Chips, 2018, 28 pages.
Gonugondla, S.K., et al., "A 42pJ/decision 3.12TOPS/W Robust In-Memory Machine Learning Classifier With On-Chip Training," 2018 IEEE International Solid—State Circuits Conference—(ISSCC), San Francisco, CA, 2018, pp. 490-492.
Han, et al, "CMOS Transconductance Multipliers: A Tutorial," IEEE Transactions on Circuits and Systems—II: Analog and Digital Signal Processing, vol. 45, No. 12, Dec. 1998.
Henzler, S., "Chapter 2, Time-to-Digital Converter Basics", Springer Series in Advanced Microelectronics 29, 2, Springer Science+Business Media B.V. 2010.
Kang, M., et al., "An In-Memory VLSI Architecture for Convolutional Neural Networks", http://ieee-cas.org/pubs/jetcas, Published Version DOI: 10.1109/JETCAS.2018.2829522, Publication Apr. 23, 2018, IEEE Circuits and Systems Society, 13 pages.
Mason, A., "Memory Basics", Michigan State, ECE 410, Chapter 13 Lecture Notes, pp. 13.1-13.34, 2010.
Solanki, Umang, "How does SRAM work?", https://www.quora.com/How-does-SRAM-work, Aug. 17, 2017, 2 pages.
Stone, Harold S. "A Logic-In-Memory Computer", IEEE Transactions on Computers, Jan. 1970, 6, pages.
Zhang, J., et al., "In-Memory Computation of a Machine-Learning Classifier in a Standard 6T SRAM Array," in IEEE Journal of Solid-State Circuits, vol. 52, No. 4, 10 pages, Apr. 2017.
International Search Report and Written Opinion for PCT Patent Application No. PCT/US19/47467, dated Dec. 6, 2019, 11 pages.

* cited by examiner

COMPUTE IN MEMORY CIRCUITS WITH MULTI-VDD ARRAYS AND/OR ANALOG MULTIPLIERS

FIELD

The descriptions are generally related to computing and more specifically to compute-in-memory circuits.

BACKGROUND

With advances in modern day semiconductor manufacturing processes and the continually increasing amounts of data generated each day, there is an ever greater need to store and process large amounts of data, and therefore a motivation to find improved ways of storing and processing large amounts of data. Although it is possible to process large quantities of data in software using conventional computer hardware, existing computer hardware can be inefficient for some data-processing applications. For example, machine learning has emerged as an effective way to analyze and derive value from large data sets in countless fields. However, machine learning performed on conventional computer systems can involve excessive data transfers between memory and the processor, leading to high power consumption and slow compute times.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" or "examples" are to be understood as describing a particular feature, structure, and/or characteristic included in at least one implementation of the invention. Thus, phrases such as "in one embodiment" or "in one example" appearing herein describe various embodiments and implementations of the invention, and do not necessarily all refer to the same embodiment. However, they are also not necessarily mutually exclusive.

Figure 1:
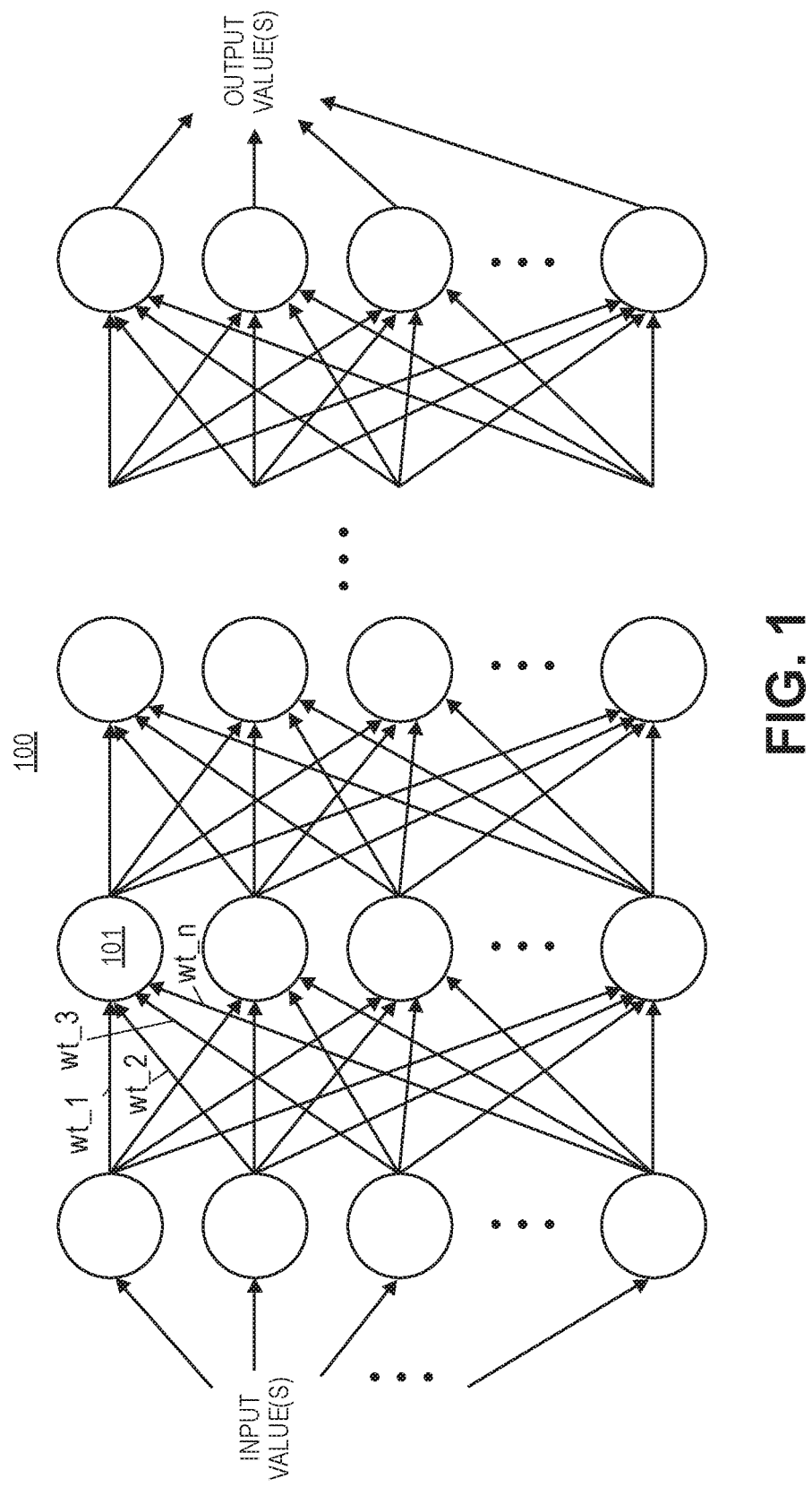
FIG. 1 depicts an exemplary neural network.

Descriptions of certain details and implementations follow, including a description of the figures, which may depict some or all of the embodiments described below, as well as discussing other potential embodiments or implementations of the inventive concepts presented herein.

DETAILED DESCRIPTION

Compute-in memory techniques are described herein. Compute-in memory (CIM) (which can also be referred to as in-memory processing) involves performing compute operations within a memory array. Thus, compute operations are performed directly on the data read from the memory cells instead of transferring the data to a digital processor for processing. By avoiding transferring some data to the digital processor, the bandwidth limitations associated with transferring data back and forth between the processor and memory in a conventional computer system are reduced.

However, compute-in memory systems can also have disadvantages. For example, compute-in memory systems typically perform weighted row access operations using modulation (e.g., pulse-width or voltage amplitude modulation). However, in order to perform row access operations using modulation, additional circuitry (for example, such as digital-to-analog converters (DACs) for voltage amplitude modulation method) is typically needed, which increases the power consumption and area of the CIM circuitry.

In contrast to conventional CIM devices, in one example, pulse-width or voltage amplitude modulation can be eliminated for weighted row access operations in CIM using a multi-Vdd approach. For example, a memory array can be mapped into multiple sub-arrays, where each sub-array receives a different voltage level. Sampling capacitors capture the read output voltages at the different voltage levels for each sub-array. Sampled values between sub-arrays can then be charge-shared to result in a single voltage level proportional to the stored multi-bit value.

Another disadvantage in some compute-in memory systems is the use of a digital input to an analog processor circuit in the CIM device. Although some analog processing circuitry is typically used, which can reduce the power consumption and improve access times, the benefits of the analog processing circuitry are diminished when one of the inputs is digital.

In contrast to conventional CIMs, in one example, two CIM memory analog outputs feed an analog processor that includes analog multipliers. The analog multiplier receives two analog inputs and outputs the product as an analog value. Capacitive charge sharing based circuitry can then be used for accumulation. By receiving analog inputs from two CIM arrays at the analog processor, the CIM device can achieve a higher bandwidth while reducing power consumption.

Thus, compute-in memory techniques described in this disclosure, such as multi-Vdd CIM device and a CIM device with a true analog multiplier, can improve CIM bandwidth and power-consumption. One application for such compute-in memory is artificial intelligence (AI), and specifically machine learning. Machine learning is a field of computer science that involves algorithms that allow computers to "learn" (e.g., improve performance of a task) without being explicitly programmed. Machine learning can involve different techniques for analyzing data to improve upon a task. One such technique (such as deep learning) is based on neural networks.

FIG. 1 depicts an exemplary neural network 100. As observed in FIG. 1, the inner layers of a neural network can largely be viewed as layers of neurons that each receive weighted outputs from the neurons of other (e.g., preceding) layer(s) of neurons in a mesh-like interconnection structure between layers. The weight of the connection from the output of a particular preceding neuron to the input of another subsequent neuron is set according to the influence or effect that the preceding neuron is to have on the subsequent neuron (for simplicity, only one neuron 101 and the weights of input connections are labeled). Here, the output value of the preceding neuron is multiplied by the weight of its connection to the subsequent neuron to determine the particular stimulus that the preceding neuron presents to the subsequent neuron.

A neuron's total input stimulus corresponds to the combined stimulation of all of its weighted input connections. According to various implementations, if a neuron's total input stimulus exceeds some threshold, the neuron is triggered to perform some, e.g., linear or non-linear mathematical function on its input stimulus. The output of the mathematical function corresponds to the output of the neuron which is subsequently multiplied by the respective weights of the neuron's output connections to its following neurons.

Generally, the more connections between neurons, the more neurons per layer and/or the more layers of neurons, the greater the intelligence the network is capable of achieving. As such, neural networks for actual, real-world artificial intelligence applications are generally characterized by large numbers of neurons and large numbers of connections between neurons. Extremely large numbers of calculations (not only for neuron output functions but also weighted connections) are therefore involved in processing information through a neural network.

Figure 2A:
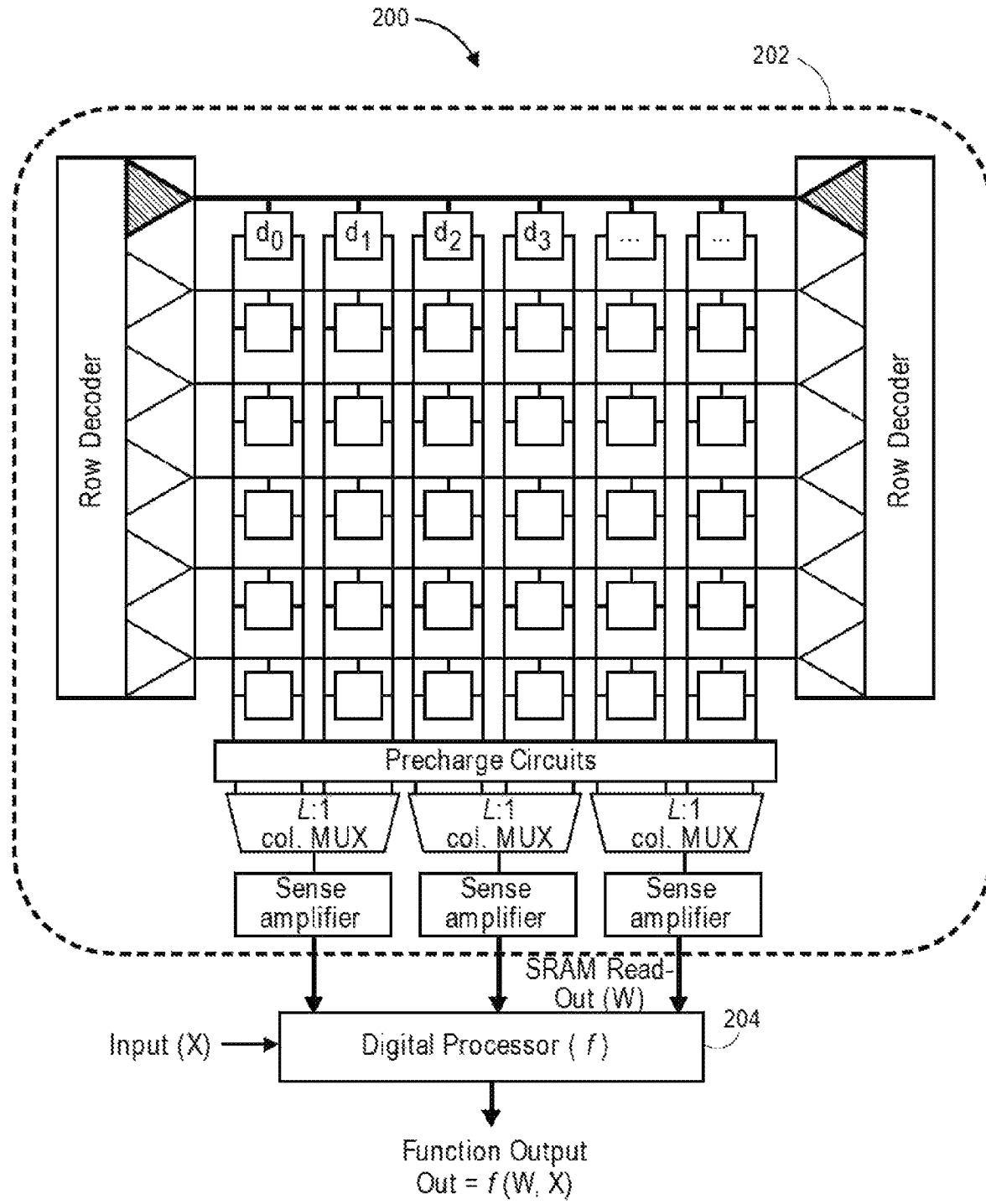
FIG. 2A illustrates an example of a conventional processing system for machine learning in which data flows from memory to a digital processor for computation.

As mentioned above, although a neural network can be completely implemented in software as program code instructions that are executed on one or more traditional general purpose central processing unit (CPU) or graphics processing unit (GPU) processing cores, the read/write activity between the CPU/GPU core(s) and system memory that is needed to perform all the calculations is extremely intensive. The overhead and energy associated with repeatedly moving large amounts of read data from system memory, processing that data by the CPU/GPU cores and then writing resultants back to system memory, across the many millions or billions of computations needed to effect the neural network is far from optimal. For example, FIG. 2A illustrates a conventional processing system for machine learning in which data flows from memory to a digital processor for computation. A traditional von Neumann computing system, such as the system 200, include a central processing unit (CPU) 204 operating on data fetched from a memory unit 202. Although the method has been shown to be successful across multiple decades, the present data-intensive applications such as machine-learning (ML) often involve large amounts of data processing. The data is typically either stored on chip in SRAM arrays or in off-chip DRAM memory. The data (often weights in deep-learning systems) is fetched from the memory and fed into the processor. Depending on the type of network, the processor in the ML accelerator performs operations such as matrix-matrix multiplication, absolute difference computation, and/or other operations. Depending on the availability of hardware resources and silicon area, the digital processor may be residing near the memory to eliminate any need for a mux and a shared bus to achieve a higher throughput. The state-of-the-art ML systems involve large amount of stored data. Transfer of data from on-chip or external memory to the digital processor suffers from extremely high communication energy overheads and bandwidth limitations due to interconnect scaling.

Figure 2B:
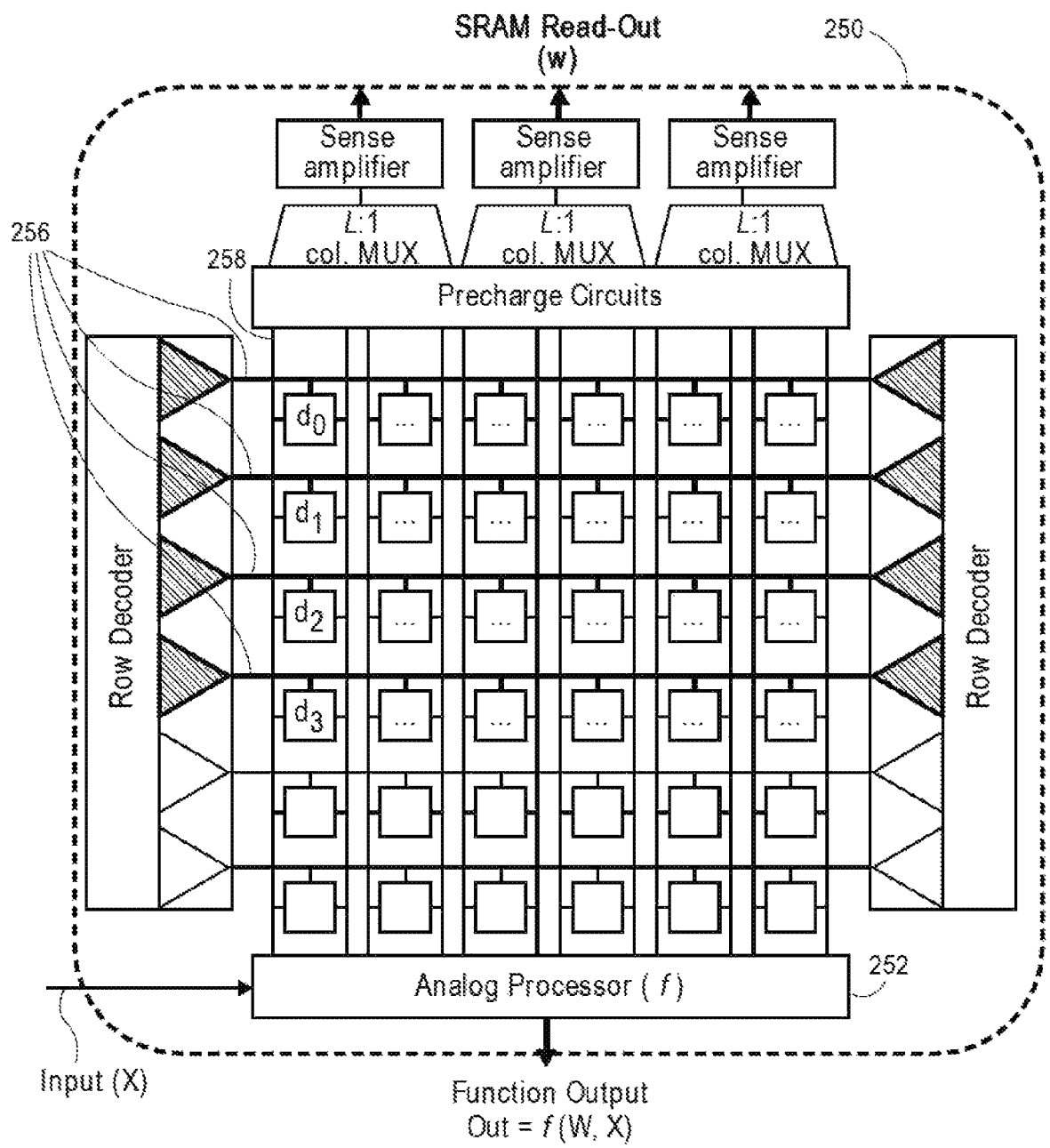
FIG. 2B illustrates an example of a compute-in memory (CIM) device in which data can be processed with circuitry in the memory device.

Compute-in memory (CIM) accelerators overcome some of the communication and bandwidth limitations of conventional computer systems by embedding the compute operations within the memory array, as shown in the compute-in memory 250 of FIG. 2B. The compute operations are directly performed on the data read from SRAM instead of transferring it over to a digital processor, essentially making the bitlines act as interconnects between memory and the analog processor 252. In one such example, the computations happen directly on the bitline voltage after the read operation. The read operation in the CIM 250 can be referred to as functional read (FR). In order to enable reading a word in a bitline (BL) (e.g., bitline 258), the data is stored in a column major format in the CIM device as opposed to a row major format used in conventional systems (see FIG. 2A). Thus, in FIG. 2B the data d0-d3 is stored in cells on a common bitline, but over multiple wordlines. In contrast, in FIG. 2A, data d0-d3 is stored in cells on a common wordlines, but over multiple bitlines. Referring again to FIG. 2B, to read a word on the bitline, multiple wordline (WL) drivers are activated at the same time. For example, as illustrated in FIG. 2A, wordlines 256 are activated at the same time. In one such example, to ensure that most significant bits (MSB) have higher weight, the MSB wordline driver is enabled for a longer duration than the least significant bit in one embodiment. In another example, the same behavior is achieved by using digital-to-analog converters (DACs) for row-access with varying voltage levels for different bit-positions. In both examples, the wordlines are accessed in a bit-position weighted manner.

In the example illustrated in FIG. 2B, prior to a read operation, the bitlines in the SRAM are pre-charged to the memory supply voltage VDD. When multiple wordline drivers are activated, the bitlines discharge to a voltage proportional to the values stored in the corresponding rows of the bitlines. As the wordline accesses are bit-position weighted, the resulting BL voltage drop (AVBL) is directly proportional to the binary stored word. For example, for a 4-bit word as shown in FIG. 2B, the total bitline voltage discharge is proportional to $\{d0+2*d1+4*d2+8*d3\}$. The AVBL is then captured on a sampling capacitor. The voltages on the sampling capacitors are directly fed into the analog compute block's bitline processors (BLP) and cross bitline processors (CBLP) to perform machine learning calculations based on charge-sharing operations. In one such example, the BLP performs an elementwise multiplication of input X and functional read's output W=ΔVBL(d[0:3]), which in turn produces a voltage corresponding to the multiplication of X*W. The CBLP then accumulates the voltages from multiple BLPs and produces a single output voltage, which corresponds to an accumulation operation in a digital processor equal to $\Sigma X_i*W_i$, referred to as "functional output" in both FIGS. 2A and 2B. As a result, a high throughput multiply and accumulate (MAC) operation for inputs X and weights W is performed in the memory with the CIM approach illustrated in FIG. 2B, as opposed to a compute block outside of the memory with a more limited bandwidth as illustrated in FIG. 2A. Thus, compute-in memory (CIM) accelerators can perform operations such as dot-product and absolute difference of vectors locally within the memory to minimize the amount of data transfer in between memory and compute engine. This reduction in data movement accelerates memory bandwidth-limited algorithms and reduces energy consumption of global data movement.

However, there are also inefficiencies in conventional CIM devices. For example, data movement for machine learning typically involves fetching and/or storing input activations, weights, and output activations to memory. CIM devices typically reduce data movement for one of these operands. For example, the computations are done in the array where one of the data values (e.g., weights) are stored, but other data values (e.g., input activations) are to fetched from memory and provided as a digital input. Thus, typical CIMs are limited in the extent to which they can reduce the energy consumption associated with data movement.

Additionally, as mentioned above, bitcells storing different bits of the same weight discharge the same BL with a current or charge proportional to their bit-positions. BL driving duration or drive strength per row is typically adjusted by pulse-width modulation in time-domain or amplitude-modulation in voltage domain, respectively. Both methods, however, incur extra area and design-cost for periphery circuit, and power and latency issues. For pulse-width modulation, the word-line pulse width is modulated with respect to the bit position of the accessed row. For example, for a pulse-width of T seconds for bit position <0>, other rows are accessed with pulse widths of $2^{bit\_position} \times T$ seconds. For amplitude-modulation, word-line voltages are modulated with respect to the bit position of the accessed row. Digital-to-analog converters (DACs) are then used to modulate the voltage on the accessed rows. Thus, the use of modulation (both amplitude and pulse-width modulation) incurs extra design-cost and area penalty for memory periphery circuits. In such conventional CIM devices, pulse-width modulation typically requires carefully tailored pulse-width generators per row. Amplitude modulation typically requires pitch-matched DACs per row. As the bit-width of the stored weights increases, the pulse-width modulation method incurs heavy latency penalties (in the order of $2^{bit-1} \times T$ s per added bit). Extra time needed for additional bits further results in memory leakage power. For the amplitude modulation method, DACs require more voltage resolution per row to accommodate for more bits (in the order of $2^{bit-1} \times \Delta V$ V per added bit). A large DAC to provide such voltage resolution on a limited pitch-matched space incurs heavy energy and area penalties. Achieving adequate noise margins under PVT (process, voltage, and temperature) variation is a challenge for both forms of functional read.

Figure 3:
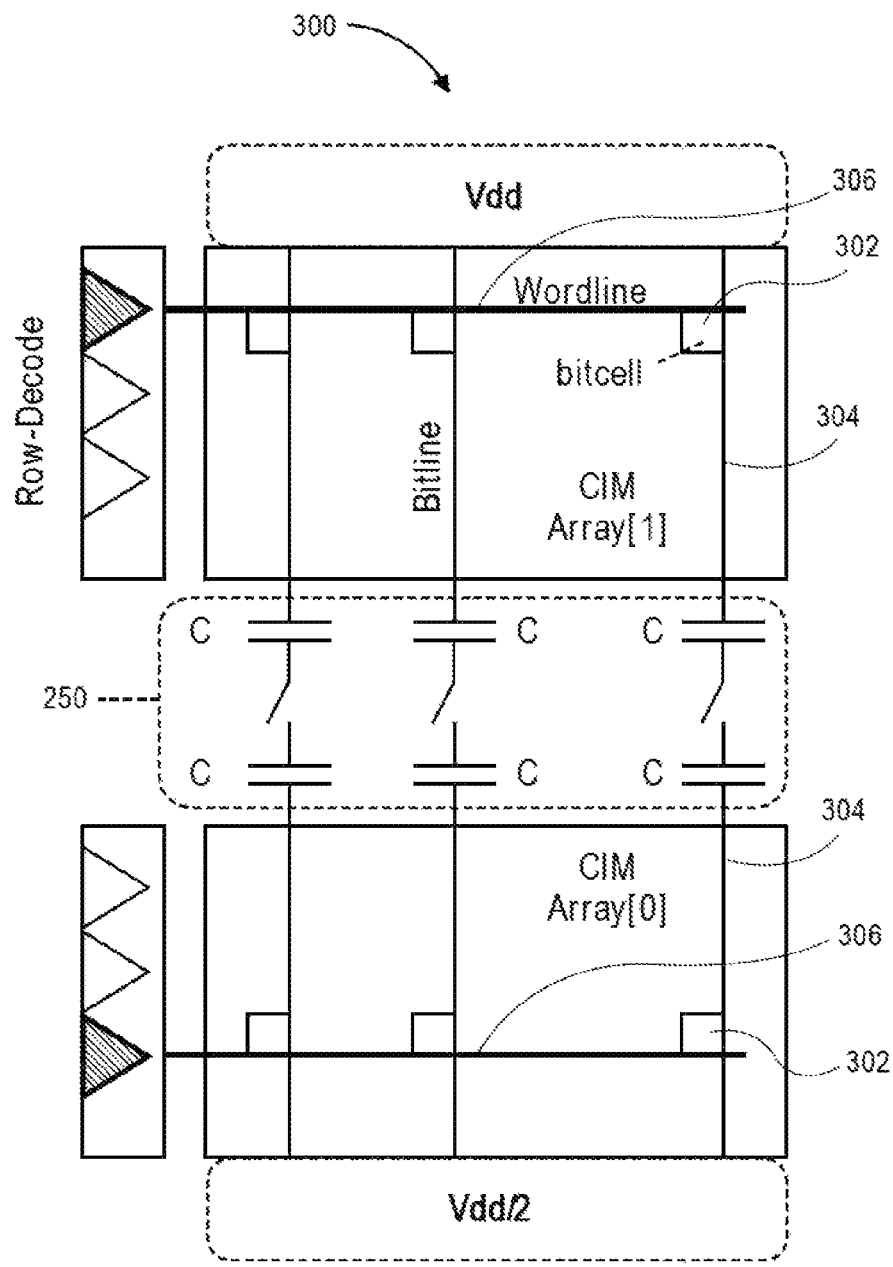
FIG. 3 illustrates an example of a two-array multi-Vdd compute-in memory device.

In contrast, a multi-Vdd array based CIM circuit can eliminate the need for time or amplitude modulation circuitry for weighted row-access in CIM devices. FIG. 3 illustrates an example of a two-array multi-Vdd compute-in memory device. The CIM device 300 includes an array of memory cells including two sub-arrays, Array[0] and Array[1]. Each sub-array includes bitcells 302 coupled with conductive access lines. In the illustrated example, the conductive access lines include bitlines 304 and wordlines 306. Other memory architectures such as three dimensional (3D) memory architectures may include different or additional access lines. Although two sub-arrays are illustrated in FIG. 3, a CIM memory device can include more than two sub-arrays.

In one example, the array of memory cells is to store weights, and the number of the sub-arrays is equal to a number of bit positions of the weights. For example, for a weight bit width of 'i' bits, the CIM block is partitioned into 'i' sub-arrays. In one such example with two sub-arrays (such as the sub-arrays illustrated in FIG. 3), the two sub-arrays correspond to a weight with two bit positions. Each of the sub-arrays Array[0] and Array[1] receives a different voltage. In the illustrated example, Array[0] receives Vdd/2 and Array[1] receives Vdd. In one example, each sub-array is connected to individual voltage generator power delivery circuits. In one such example, each voltage generator receives a global supply voltage (e.g., Vdd) as input and generates an array voltage Array_Vdd[i] that is supplied to the CIM sub-array[i]. Array_Vdd[i] can be used for to operate the whole sub-array, or can be used for precharge while the rest of the sub-array is powered by another voltage, such as Vdd. Using Array_Vdd[i] for precharge and another voltage to power the other circuitry in the sub-array can be beneficial if, for example, Array_Vdd[i] has a magnitude that is too low for reliable operation of all circuitry in the sub-array.

Referring again to FIG. 3, within a CIM sub-array, bitlines are connected to sampling capacitors that are pre-charged to Array_Vdd[i]. Each weight bit w[i] is mapped to its designated CIM-array[i]. For an array of N columns, N weights are then mapped to a single row over 'i' arrays. At every cycle, a single row of N columns is accessed per sub-array and the bitcells drive the bitlines and sampling capacitances. Then capacitances are connected column-wise for charge-sharing. As a result, bitcells discharge the sampling capacitors that are pre-charged to Array_Vdd[i] proportional to their bit positions. In the exemplary two-array CIM block shown in FIG. 3, CIM_array[0] stores $W_N[0]$ and CIM_array[1] stores $W_N[1]$, where $W_N[i]$ is a 1×N vector representation of the i'th bit position of the weights stored in the array. In this example, at the end of every clock cycle, N×2-bit weights (N weights from each of the two sub-arrays) drive the sampling capacitance voltages proportional to {w[0]+2*w[1]} after charge-sharing column-wise. Note that in addition to the arrays providing analog outputs to the processing circuitry, the arrays can also be accessed like a conventional array (e.g., the array can provide digital outputs to a digital processor in addition to providing analog outputs to an analog processor).

Figure 4:
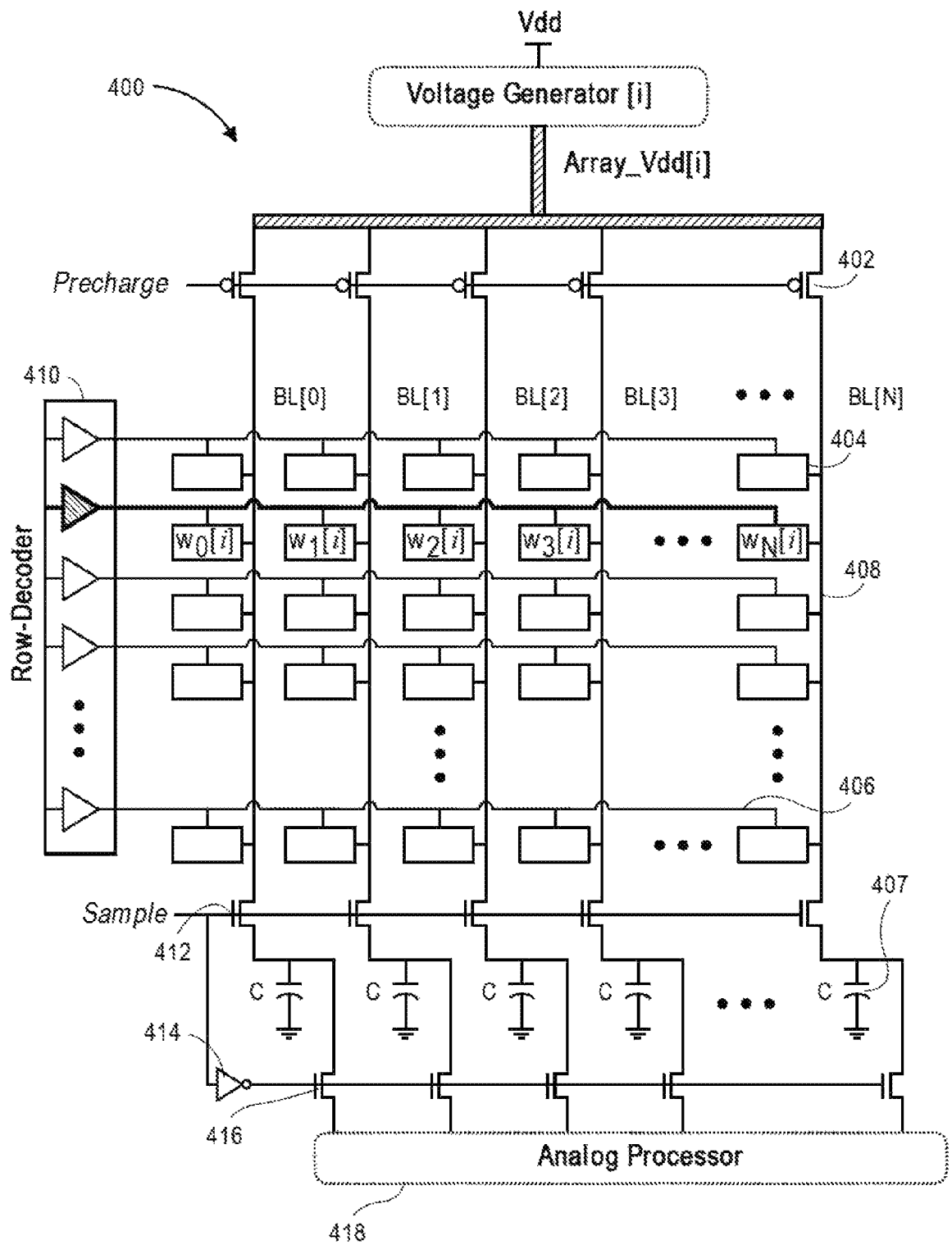
FIG. 4 illustrates an example of additional circuit details of one sub-array of a multi-Vdd compute-in memory device.
Figure 13:
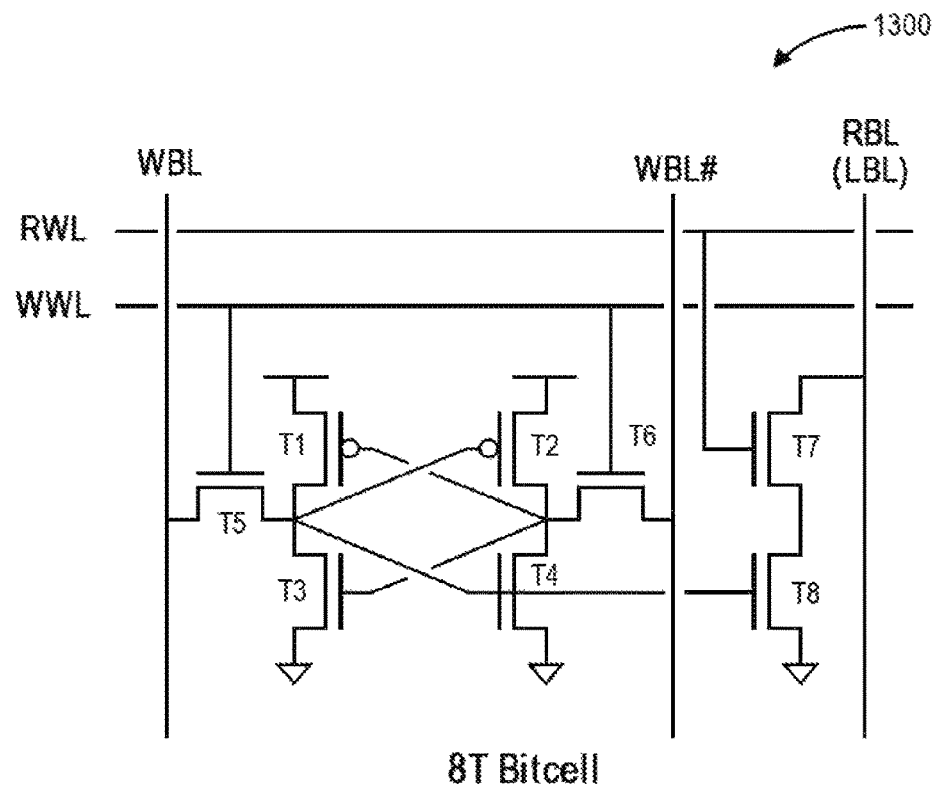
FIG. 13 is an example of an eight transistor (8T) SRAM cell.
Figure 14:
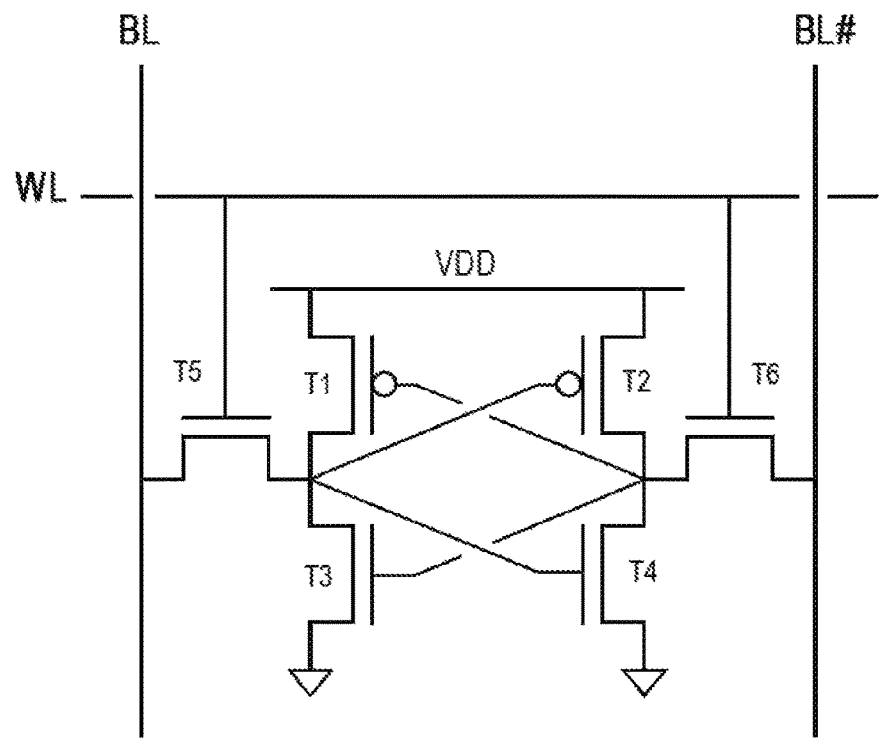
FIG. 14 is an example of a six transistor (6T) SRAM cell.

FIG. 4 shows additional circuit details of one sub-array (e.g., such as one of the sub-arrays Array[0] or Array[1] of FIG. 3A). The sub-array 400 can be one of two or more sub-arrays. For example, a CIM device could include four sub-arrays coupled together at the analog processor block, where each of the four sub-arrays is like the sub-array 400. The sub-array 400 illustrated in FIG. 4 includes bitcells 404 coupled with wordlines 406 and bitlines 408 (the bitlines are labeled in FIG. 4 as BL[0]-BL[N]). The bitcells 404 can be any type of memory cell, such as 6T, 8T, or other types of bitcells, with low-swing or full-swing bitline discharge. FIGS. 13 and 14, described below, illustrate examples of 6 T and 8 T bitcells. For simplicity, the bitcells 404 are depicted with a single bitline. The sub-array 400 is depicted in FIG. 4 as having its own row-decoder 410, however, row decoders can be shared amongst more than one sub-array. In one example, the row-decoder 410 includes conventional digital pitch-matched logic gates, and row-access is performed by a single pulse width.

In multi-Vdd CIM circuit partitioning, each sub-array receives a different voltage. In the example illustrated in FIG. 4, each bitline of the sub-array 400 is coupled with the voltage Array_Vdd[i], where the sub-array 400 is the ith sub-array. There are different ways to supply different voltages to the sub-arrays. In one example, every sub-array has (or is coupled with) a voltage generator circuit. Each voltage generator circuit receives a supply voltage. Although the voltage supplied to the voltage generator circuits is referred to herein as Vdd for simplicity, the voltage supplied to the sub-arrays' voltage generator circuits can be a voltage other than Vdd.

In one example, each sub-array has its own voltage generator circuit, but if one of the sub-arrays is to receive Vdd, then the voltage generator circuit for that sub-array is bypassed (e.g., with a switch). In this example, one sub-array would have unnecessary voltage generator circuitry. However, including a separate voltage generator circuit for each sub-array may have the advantage of simplifying the overall design and testing of the CIM device due to each sub-array being substantially the same to one another. In another example, the sub-array receiving Vdd does not have its own voltage generator block, but every other sub-array has one. This approach has the benefit of eliminating the voltage generator circuitry for one sub-array, but may increase overall design and testing costs due to one sub-array being different than the others. In another example, none of the sub-arrays have a dedicated voltage generator block, and the voltages are received with power lines/wires to the memory sub-arrays. In one such example, the voltages are generated external to the CIM device, or even outside of the chip at the board level. Regardless of the implementation, each of the sub-arrays receives a voltage that is different than the voltage received by the other sub-arrays.

In the example illustrated in FIG. 4, the sub-array 400 is supplied by a separate voltage generator. Thus, each bitline of the sub-array 400 is coupled with a voltage source Array_Vdd[i] (where sub-array 400 is the ith sub-array), where the voltage Array_Vdd[i] is supplied by the Voltage Generator[i]. The Voltage Generator[i] can include a linear regulator, switched capacitor network, buck converter, and/or any other type of voltage generation circuitry. The Voltage Generator[i] receives Vdd and then provides Array_Vdd[i], which is either Vdd or another voltage to the sub-array 400. Depending on hardware specifications, bit-precision, and target voltage requirements, voltage generators may generate voltages higher or lower than Vdd. In one embodiment where Array_Vdd[i] Vdd, no voltage-domain level-shifters are required in the row decoder (as shown in FIG. 4). In another example where Array_Vdd[i]>Vdd, level-shifters can be placed in between row-decoder buffers and CIM_arrays in a pitch-matched fashion for the arrays with higher voltage levels. In similar fashion, non-pitch-matched level-shifters may be placed in between outside logic and the row-decoder, if array row-decoder(s) are also connected to Array_Vdd[i]>Vdd. In one embodiment, the Voltage Generator[i] is capable of supplying both Array_Vdd[i] and memory supply Vdd (i.e. Vdd) to the CIM block depending on compute-in-memory operations mode or conventional memory read/write operations mode, respectively.

Within the sub-array, a pre-charge signal controls connection devices or switches 402 (e.g., PFET transistors) to pre-charge the bitlines 408 and sampling capacitors 407 to Array_Vdd[i]. When a wordline is activated, the bitlines are allowed to float, and then when the row is activated, the bitcells will drive the floating bitlines (e.g., to 0 V or to (Vdd−ΔV) V depending on bitcell type, or leave floating at Array_Vdd[i]). A Sample signal then controls the connection of the sampling capacitors for charge-sharing (the connection devices 412 may be, for example, NFETs, PFETs, or transmission-gates, depending on hardware requirements). In one example, at every clock cycle, the Sample signal is activated when the wordline is activated, connecting the bitlines to the sampling capacitors 407. Once the bitcells discharge the sampling-caps 407, the Sample signal is deactivated and charge-sharing between arrays is performed in the analog processor 418, completing the functional-read operation. The bitlines and sampling-caps are then pre-charged to Array_Vdd[i], and the same operations can be repeated in the next clock cycle on another (e.g., consecutive) row. Thus, in this example there are two switches on a bitline: a first switch 412 is ON and the second switch 416 is OFF when bitcells are driving the bitline. This way, the bitline voltage is sampled on the connected caps 407. Once sampling is complete, the first switch 412 is OFF and second switch 416 is ON, so that the analog processor receives the sampled voltages on the caps.

The analog processor 418 includes analog circuitry to perform analog computations on inputs. The inputs to the analog processor 418 can include analog voltages sampled from the sub-array 400 and other sub-arrays coupled with the analog processor 418 as well as digital and/or analog voltages received from other processors and/or memory arrays. In one example, the circuitry includes a multiply-and-accumulate (MAC) circuit to multiply an input by the voltages sampled at the capacitors after charge sharing. The MAC circuit performs an elementwise multiplication of the input and the voltages sampled at the capacitors 407 after charge sharing, and sum voltage outputs of the elementwise multiplication. Such circuitry can be referred to as bit line processors (BLPs) and cross bitline processors (CBLPs), mentioned above, where the BLPs and CBLPs are tightly integrated to the sampling capacitors 407 and perform the dot-product operation based on charge-sharing principles. In one such example, the BLP performs an elementwise multiplication of an input (not shown in FIG. 4) and the functional read's output. The CBLP then accumulates the voltages from multiple BLPs and produces a single output voltage, which corresponds to an accumulation operation. In another embodiment, the same multiply and accumulate operation can be implemented with an analog-multiplier based circuit, described below.

Figure 5:
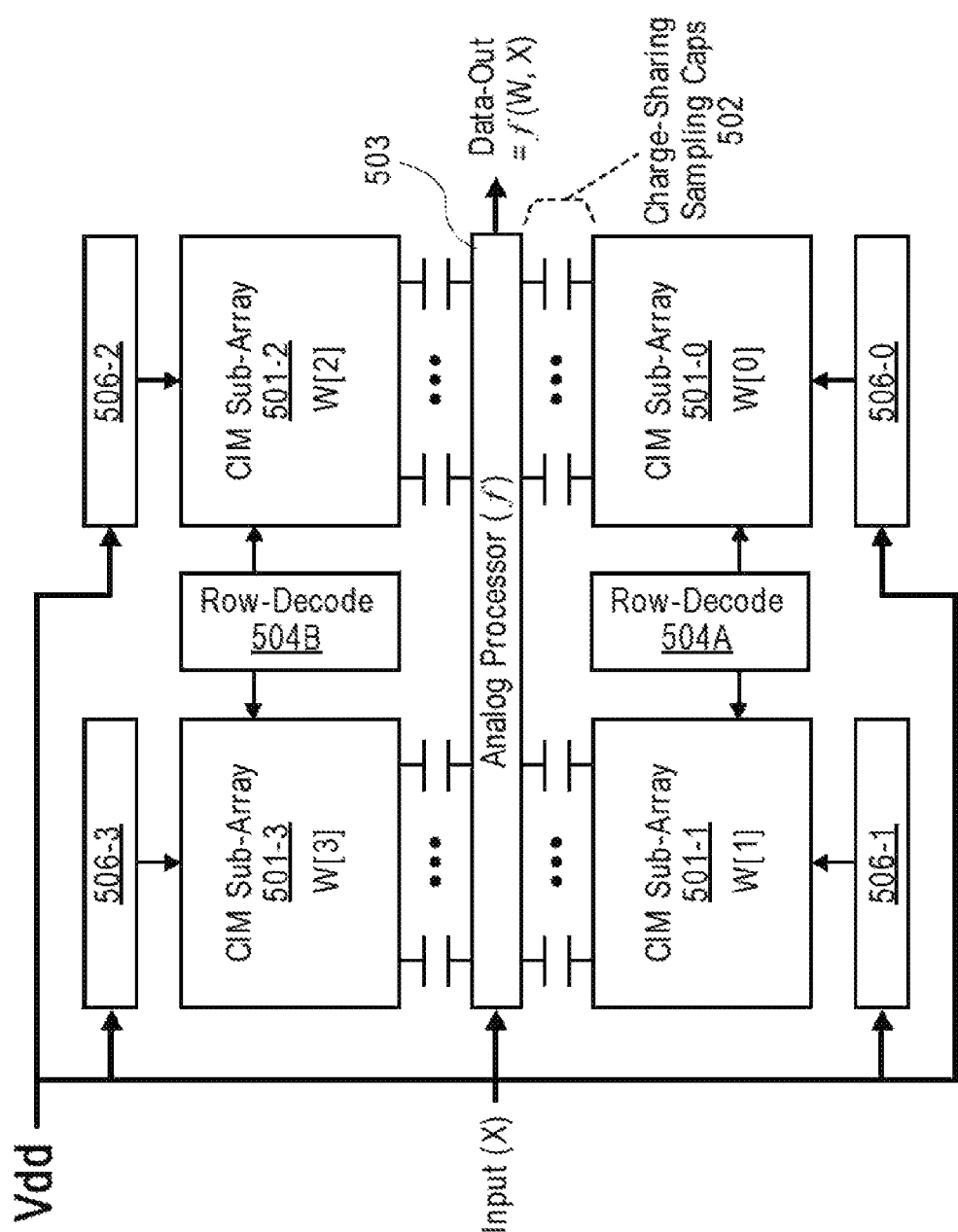
FIG. 5 illustrates an example of top-level partitioning for multi-Vdd CIM sub-arrays.

FIG. 5 illustrates an example of top-level partitioning for multi-Vdd CIM sub-arrays. The example in FIG. 5 illustrates 4-bit weights mapped to 4 sub-arrays 501-0, 501-1, 501-2, and 501-3. Voltage generator blocks 506-0-506-3 receive Vdd and distribute the Array_Vdd[i] (where i in FIG. 5 is 0, 1, 2, or 3) locally to the corresponding CIM_array[i] (501-0-501-3), minimizing the extra wiring. Note that the voltages provided to the sub-arrays can be static or dynamic (e.g., changeable dynamically during runtime or offline). In one such example, the CIM device includes one or more mode register(s) that can be programmed to adjust or set the array voltages. In the example illustrated in FIG. 5, row-decoders 504A and 504B are shared to save area and space.

Each sub-array 501-0-503-3 can be the same or similar to the sub-arrays of FIG. 3, and includes its own memory cells, bitlines and sampling capacitors. The outputs W[i] of the sub-arrays are input to the analog processor 503 via the sampling capacitors 502. The voltages are initially stored on the separate sampling capacitors 502 to enable sampling. Once the sampling capacitors are connected (e.g., in response to a signal), charge sharing occurs to bring the capacitors to the same voltage level, which is similar to performing an averaging or accumulation operation. The analog processor also receives an input X, which can be an analog or digital input. The analog processor performs some operation on the inputs (e.g., F(W,X), where W={W[0], W[1], W[2], W[3]}) and outputs an analog voltage Data-Out.

Thus, using a multi-Vdd CIM array and mapping each bit position to a CIM partition supplied by a different array voltage can enable better performance, lower power usage, and a smaller footprint relative to conventional CIM devices. Unlike conventional CIM arrays in which a sum operation is performed using pulse width or amplitude modulation on the wordlines to read a multi-bit weight on one single bitline, in this example there are multiple sub-arrays with separate bitlines connected together via charge sharing capacitors. The bitlines from the different sub-arrays provide the different bit positions of the weights, which are then summed together via charge sharing. Therefore, the same result can be achieved without needing pulse-width modulation or DACs. Furthermore, conventional digital memory decoders can be utilized, which provides better periphery area, energy, delay, and technology scaling. Multi-bit CIM functionality is determined based on the array voltages, which can be generated centrally per sub-array, minimizing the effects of within-die variation (in contrast to previous techniques where separate circuits generate pulse widths/WL voltages per row).

Figure 6:
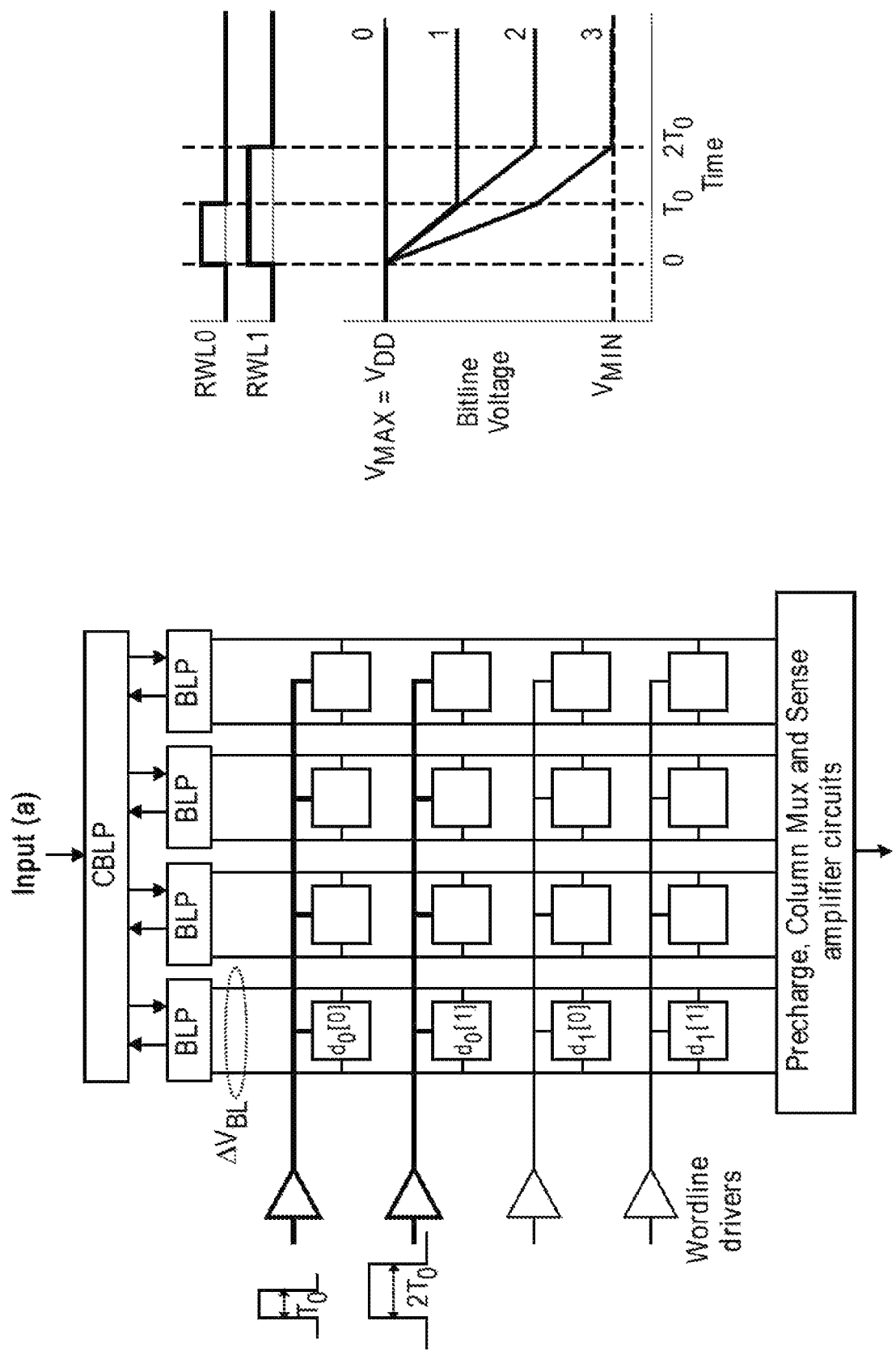
FIG. 6 shows an example of a CIM device.

As mentioned above, another disadvantage in some compute-in memory systems is the use of a digital input to an analog processor circuit in the CIM device. CIM devices that perform MAC operations typically implement pitch-aligned multiplier circuits into the memory array. Given the area restrictions of CIM devices, multipliers are analog computation blocks taking one or more digital inputs. For example, the digital inputs are typically read from memory in a traditional manner, with lower effective bandwidth than the CIM device, and with higher data movement energy and latency overhead. FIG. 2B, illustrates one such example in which a digital input X is input to the analog processor 252. FIG. 6 shows another example of a CIM device. As illustrated in FIG. 6, two 2-bit weights (d0 and d1) are stored column-wise in the memory array (all bits in a weight share the same bitline). The rows for all weight bits are accessed simultaneously and the current is summed onto the shared bitline. In the example illustrated in FIG. 6, two rows are activated at a given time to access a single 2-bit weight. Thus, the rows storing $d_0[0]$ and $d_0[1]$ are simultaneously accessed, and in a subsequent access, the rows storing $d_1[0]$ and $d_1[1]$ are simultaneously accessed. Although 2-bit weights are illustrated in FIG. 6, weights having other bit lengths (e.g., 4-bit weights, 8-bit weights, etc.). may be accessed in a similar fashion. Wordline pulse duration or voltage is modulated to set the contribution of the bits according to bit position (e.g., most significant bit (MSB), least significant bit (LSB), etc). In the illustrated example, pulse-width modulation is used to read the 2-bit weights on a single bitline. Thus, a pulse having the length of $T_0$ is applied to one wordline and a pulse having the length of $2*T_0$ is applied to a second wordline, resulting in a larger charge contribution. The charge contribution of the bitcell associate with the wordline is proportional to the bit-position of the bit stored on that wordline. Thus, during one read, a voltage that is proportional to the multi-bit weight value is generated on the bitline. This functional read collects data from a large portion of the memory for increased throughput. Since all computation is done on one low-swing wire, interconnect energy is reduced. However, in addition to the disadvantages of using modulation discussed above, the analog processing circuitry (e.g., the cross bitline processor (CBLP)) receives a digital input a. The use of a digital input to the CIM analog processor reduces some of the benefits of using analog processing circuitry.

Figure 7:
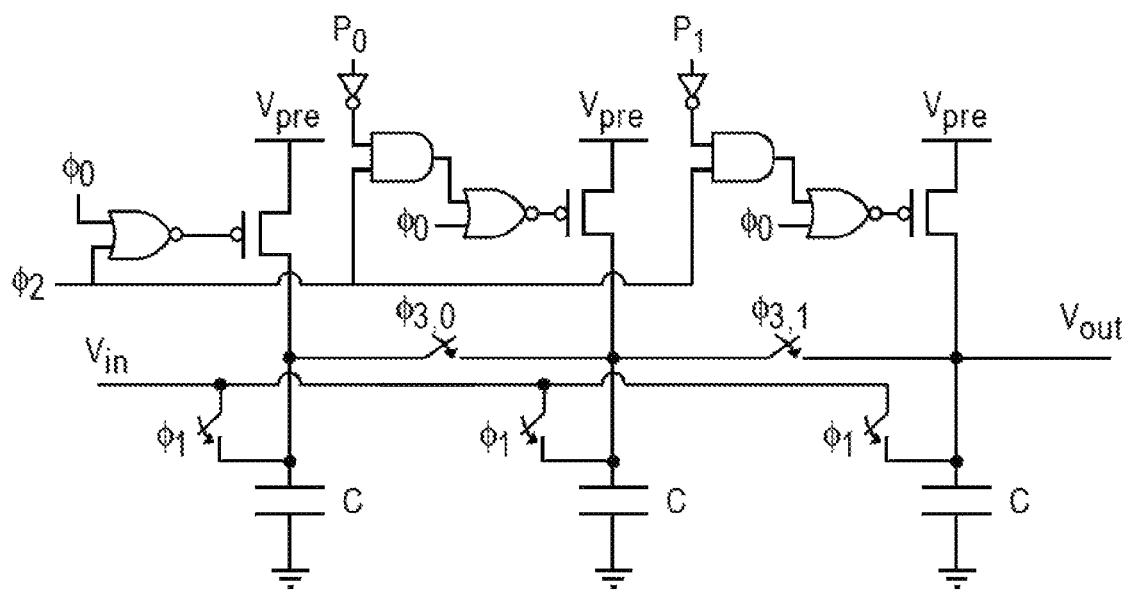
FIG. 7 illustrates an example a multiply operation in a Bit-line Processor (BLP) using one analog and one digital operand.
Figure 7:
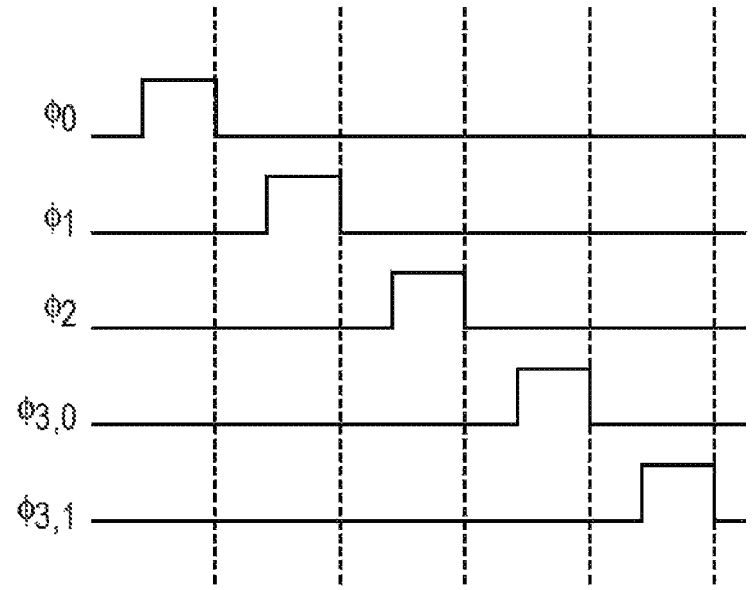

One way CIM devices perform MAC is to implement an analog multiply within the SRAM array using capacitor sharing between one analog and one digital input. For example, FIG. 7 illustrates an example a multiply operation in a Bit-line Processor (BLP) using one analog and one digital operand. The analog voltage generated by the functional read is multiplied by a digital value using charge sharing. The analog functional read value is driven onto all the caps at node $V_{in}$. The caps are selectively charged to $V_{PRE}$ based on a digital input vector (p0-p1) to perform 1-bit partial sum generation. Then the capacitors are shared in sequence, with each charge sharing halving the contribution of each 1-bit partial sum to the final multiplication output. The multiplication output is represented as an analog voltage. Note that the output has the same voltage range as the input, but represents a larger range of output codes. However, the digital input is read from a traditional memory at a lower throughput than the CIM and with larger energy overhead for data movement.

Another way that CIMs can perform MAC is by converting analog CIM output to digital using an ADC before performing a digital multiply and accumulate. However, performing MAC in the digital domain requires many ADC circuits between the CIM and the computation logic. Such ADCs are typically large and difficult to pitch match with memory arrays. Also, digital computation takes more energy than analog computation.

Another way that CIMs can perform MAC is by implementing multiplication bit-serially as conditional memory accesses. For example, each memory bitcell performs a 1-bit multiply (AND operation) between a 1-bit input activation on the wordline and a 1-bit weight stored in the memory cell. However, bit serial computation is inherently binary. Bit serial computation can natively implement binary neural networks, with reduced machine learning capabilities and reduced precision for a given workload. Higher precision computation can be implemented by shifting and accumulating bit-serial results. However, this incurs a higher additional latency cost, which translates to lower throughput and higher SRAM leakage energy per operation.

In contrast to conventional CIM devices, in one example, two CIM memory analog outputs feed an analog processor. For example, an analog processor circuit receives multi-bit input activations (X) and multi-bit weights (W) from CIM arrays as analog voltages. Thus, the throughput is increased, and energy decreased, for reading both of these operands. The product of W and X can then be computed using their analog voltage representation, without converting the values to digital with an ADC beforehand. For example, in the periphery of the CIM device, the analog processor circuit performs analog-analog multiply using a mixer that is pitched matched to the memory array. After the multiplication, the voltages can be accumulated with an analog charge sharing or current summing circuit, and still follow the mathematical order of operations for deep learning. This greatly reduces the number of ADCs required. For example, performing the product with analog voltages enables using one ADC for every group of columns that are accumulated together (for example, 1 ADC per 64 columns) instead of one ADC per CIM array column that would be needed if one or both of the operands is converted to digital.

Figure 8:
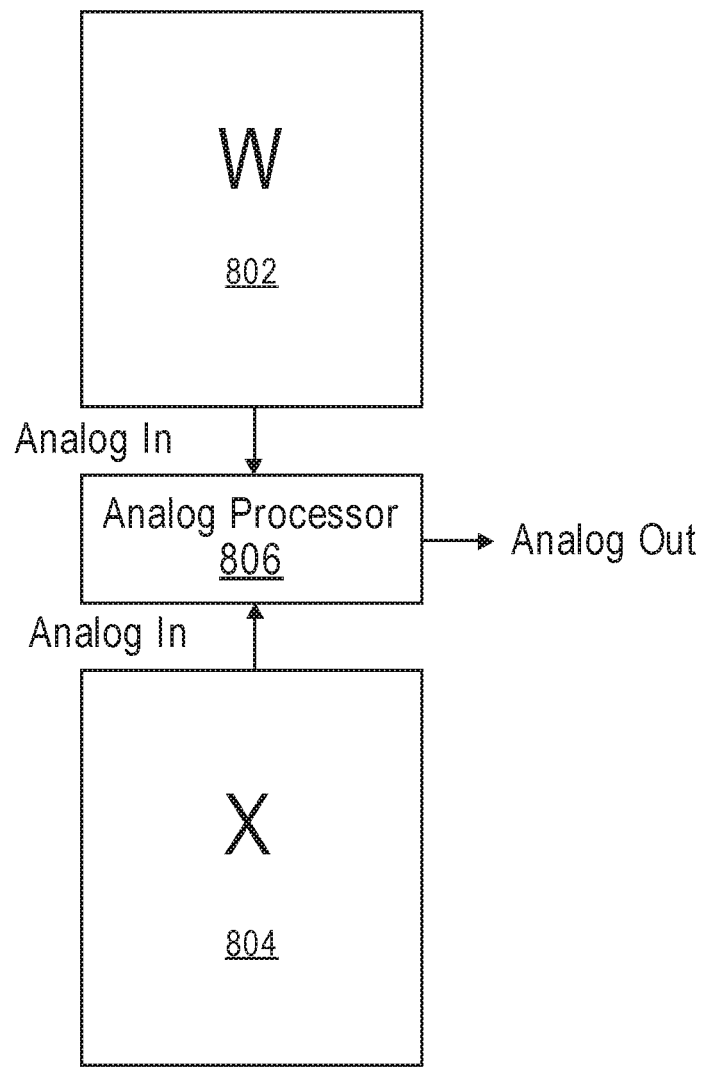
FIG. 8 illustrates an example of two CIM array analog outputs feeding an analog processor.

FIG. 8 illustrates an example of two CIM analog outputs feeding an analog processor. In one example, the two CIM arrays 802 and 804 and the analog processor are a part of a single computing device or accelerator (e.g., within the same package). The analog processing circuitry 806 includes analog multipliers that receive two analog inputs (W and X) from memory arrays 802 and 804. Capacitive charge sharing based circuitry can be used for accumulation. In this case, the inputs X and weights W feed the analog processing unit. This allows for both inputs and weights to use the higher bandwidth and lower energy functional read operation.

Figure 9:
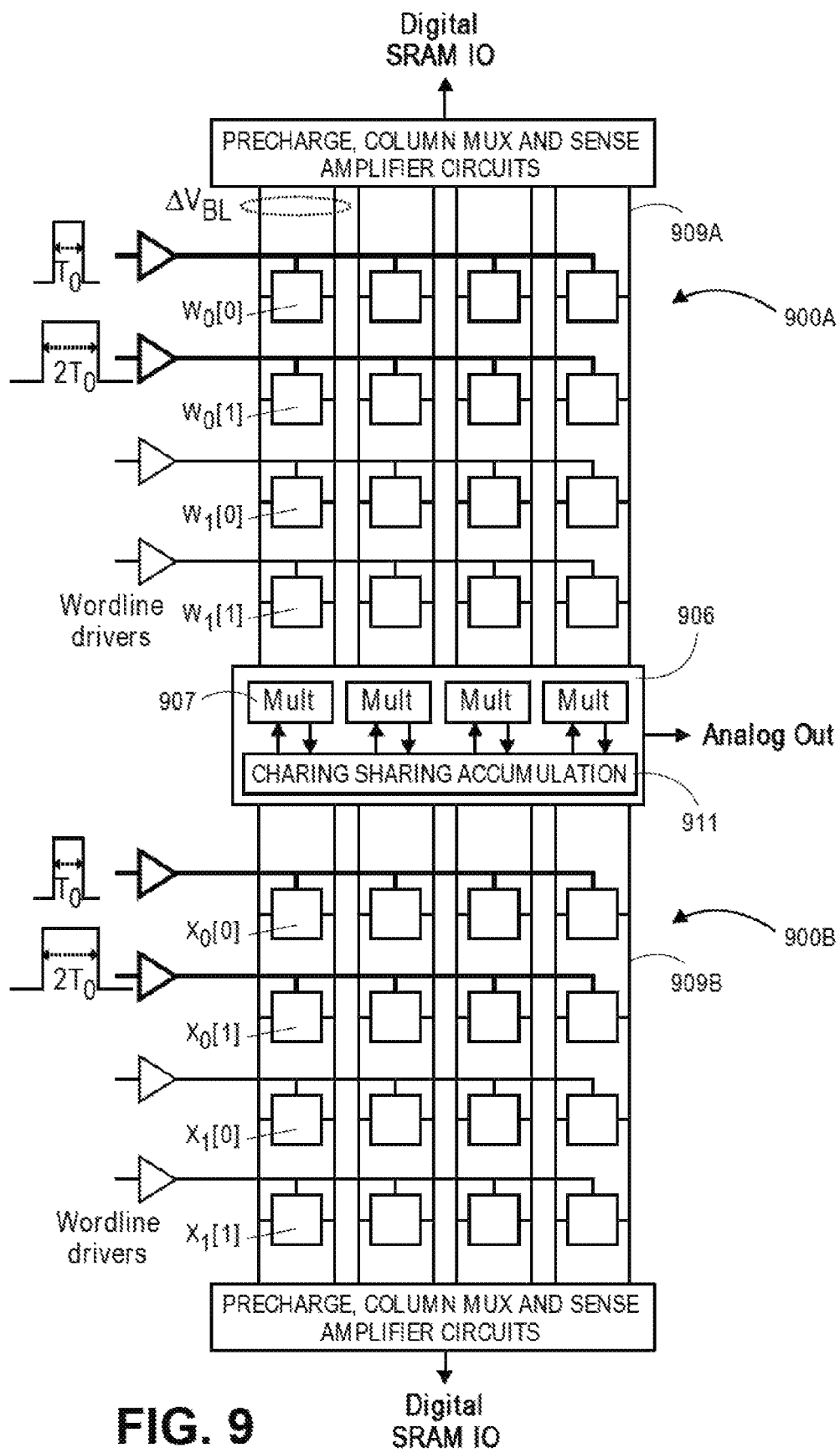
FIG. 9 illustrates an example of two CIM array analog outputs feeding an analog processor.

FIG. 9 illustrates a more detailed diagram of one example of two CIM arrays 900A and 900B feeding an analog processor 906. The two CIM arrays 900A and 900B include storage cells, such as 6T cells or 8T cells. In the example illustrated in FIG. 9, the CIM array 900A stores data $w_0$-$w_1$ and the array 900B stores data $x_0$-$x_1$, where $w_x$ and $x_x$ are 2-bit data values. The data can be weights and inputs for machine learning operations, or any other data. In the illustrated example, the CIM arrays store multi-bit weights and inputs that are accessed using modulation, as described above. Like FIG. 6, FIG. 9 depicts pulse-width modulation in order to access the 2-bit weights on a single bitline. However, the arrays 900A and 900B can include multi-Vdd arrays (which do not require modulation), described above with respect to FIGS. 3-5. In one such example, the array 900A (and/or the array 900B) would be partitioned into multiple sub-arrays, and the functional read would be performed using charge sharing instead of current summing. The data stored in the CIM arrays 900A and 900B can also be accessed like a typical SRAM via sense amplifier circuits to provide a digital output. The CIM arrays 900A and 900B are also coupled together via analog processing circuitry 906.

The analog processing circuitry 906 in FIG. 9 includes analog multiplier circuits 907. The processing circuitry can include one analog multiplier for each bitline. For example, the analog processing circuitry 906 includes one analog multiplier between the bitline 909A of the CIM array 900A and the bitline 909B of the CIM array 900B. A given analog multiplier 907 receives analog voltage inputs from the bitlines of the CIM arrays 900A and 900B, multiplies the analog voltage inputs, and outputs an analog voltage output. The outputs from all the analog multipliers are accumulated with charge sharing accumulation circuitry 911. The charge sharing accumulation circuitry 911 then outputs an analog output voltage (Analog Out) that is the result of a multiply and accumulate (MAC) operation on the data stored in the arrays 900A and 900B. Unlike conventional CIMs, both inputs for the MAC operation are analog voltages. The energy efficiency of the SRAM access and MAC is thus improved since the operations use low-swing analog computations.

Figure 10A:
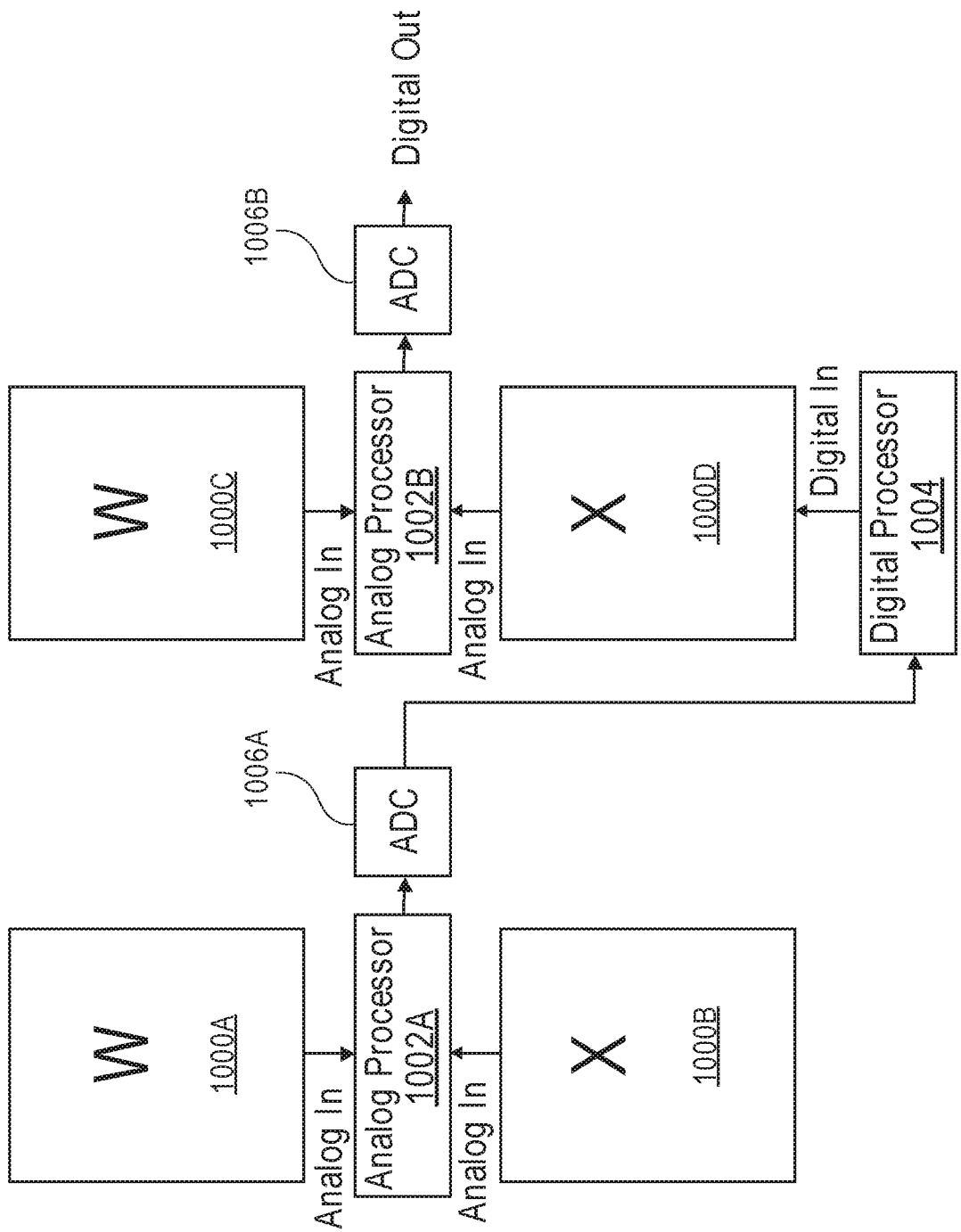
FIGS. 10A, 10B, and 11 illustrate examples of cascading multiple CIM arrays and multiple analog processors.
Figure 10B:
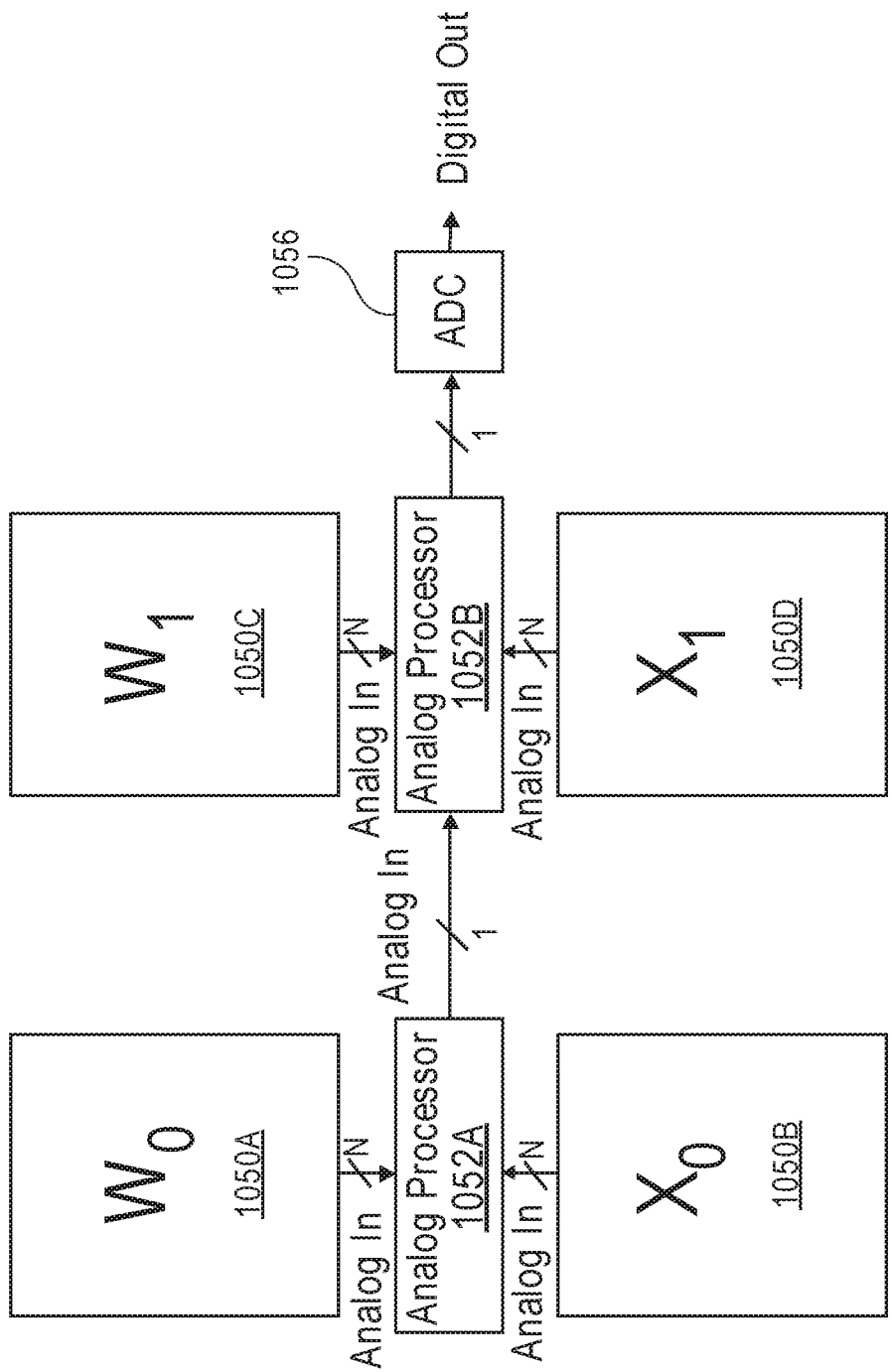
Figure 11:
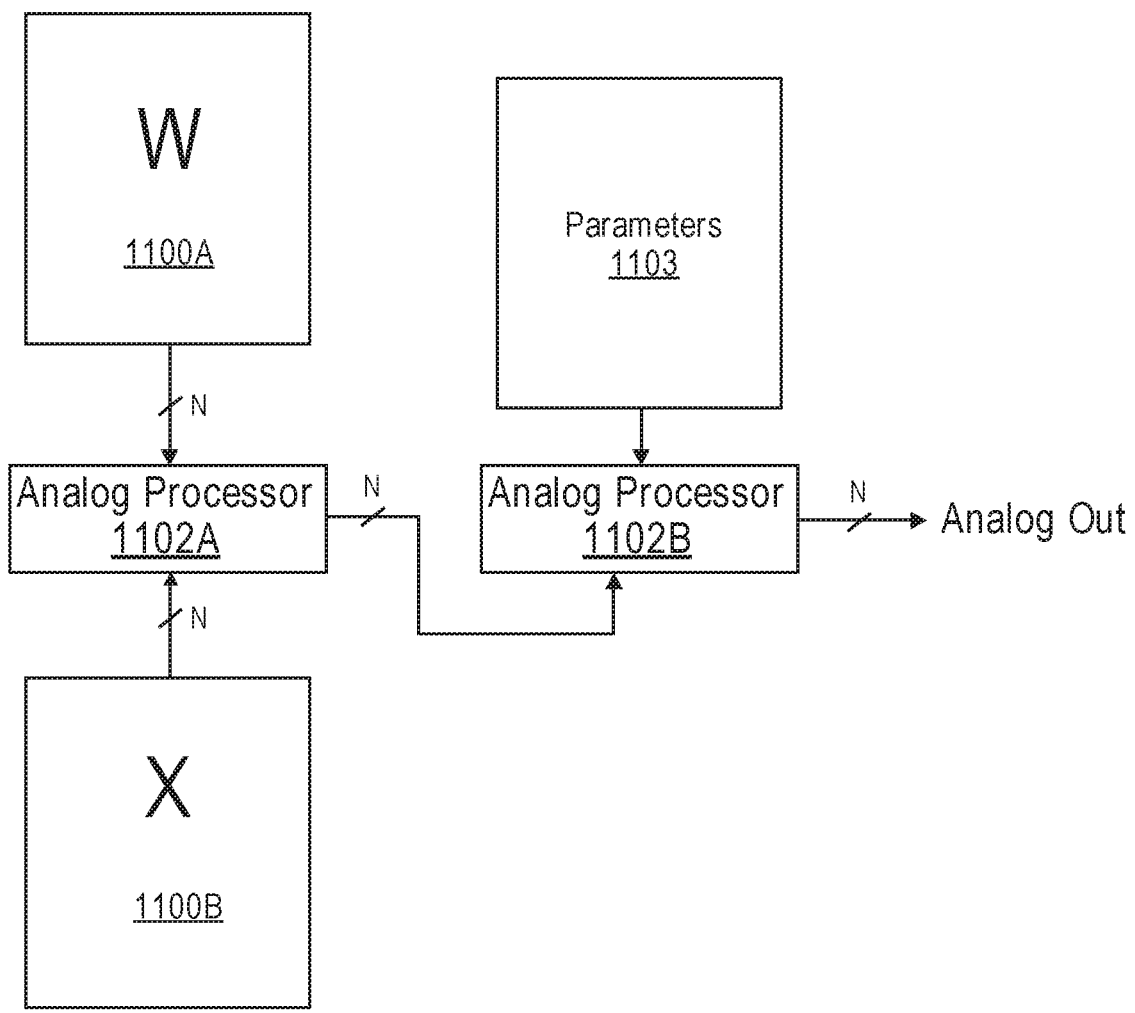

FIGS. 8 and 9 illustrate examples in which two CIM arrays provide analog outputs to an analog processor. However, more than two CIM arrays can be cascaded or pipelined. FIGS. 10A, 10B, and 11 illustrate examples of cascading multiple CIM arrays and multiple analog processors. FIG. 10A is a block diagram showing how CIM compute blocks can be cascaded using ADCs and digital processing to process, for example, two consecutive neural network layers. The first compute block (e.g., the CIM arrays 1000A and 1000B and the analog processor 1002A) is coupled with a second compute block (e.g., CIM arrays 1000C and 1000D and the analog processor 1002B) via an ADC 1006A and a digital processor 1004. The CIM arrays 1000A and 1000B of the first compute block can store a first layer of weights and inputs and the CIM arrays 1000C and 1000D of the second compute block can store a second layer of weights and inputs of a neural network. The weights and inputs from the CIM arrays 1000A and 1000B are input to the analog processor 1002A, where a multiply and accumulate operation is performed. The output of the MAC operation is then stored in the CIM array 1000D. To store the outputs from the first layer in the array 1000D, the outputs are converted to the digital domain via the ADC 1006A and interpreted and stored by the digital processor 1004. The inputs stored in the array 1000D are then read and provided as analog voltages to the analog processor 1002B along with the analog inputs from the CIM array 1000C, which stores weights for the second layer of the neural network. The analog processor 1002B then performs a multiply and accumulate operation on the inputs and outputs an analog voltage. The analog voltage can then be transformed to the digital domain via a second ADC 1006B.

FIG. 10B is another example of how CIM compute blocks can be cascaded together. In the example illustrated in FIG. 10B, the CIM arrays 1050A and 1050B each provide the analog processor 1052A with N analog inputs. Each of the N analog inputs can represent, for example, a vector with N elements. The analog processor 1052A can the multiply the analog inputs received from the CIM arrays 1050A and 1050B to output a single analog output (e.g., $X_0*W_0$). The output from the analog processor 1052A is input to a second analog processor 1052B. The second analog processor 1052B also receives analog inputs from the CIM arrays 1050C and 1050D. In one example, the second analog processor receives the input from the first analog processor 1052A to its accumulation circuitry, and receives the inputs from the CIM arrays 1050C and 1050C to its multiplier circuitry. Thus, the second analog processor 1052B multiplies the analog inputs from the CIM arrays 1050C and 1050D and can then sum the product (e.g., $X_1*W_1$) with the input from the first analog processor (e.g., $X_0*W_0$) to obtain $X_0*W_0+X_1+W_1$. The output of the second analog processor 1052B is an analog output, which can be used in its analog form or converted to a digital output via the ADC 1056. Thus, FIG. 10B illustrates an example in which CIM compute blocks can be cascaded without ADCs by inputting the analog output of one analog processor to the analog accumulation circuitry of another analog processor. Although FIGS. 10A and 10B illustrate two CIM compute blocks cascaded together, more than two CIM compute blocks can be cascaded together in a similar fashion.

FIG. 11 is a block diagram illustrating another example of how CIM compute blocks can be cascaded without ADCs by using the analog output directly. FIG. 11 differs from FIG. 10B in that the output from the first analog processor is fed to the multiplier circuitry of the second analog processor (as opposed to being fed to the accumulation circuitry as illustrated in FIG. 10B). In the example illustrated in FIG. 11, a first compute block (e.g., the CIM arrays 1100A and 1100B and the analog processor 1102A) is coupled with a second compute block (e.g., the CIM array 1103 and the analog processor 1102B). In this example, the CIM arrays 1100A and 1100B output N analog voltages to the analog processor 1102A, which outputs N analog outputs to a second analog processor 1102B. The second analog processor 1102B also receives analog inputs (labeled parameters, which may also be N analog inputs) from a third CIM array 1103 and performs an operation on the parameters and the output of the first CIM compute block. The second analog processor 1102B then outputs an analog value. In one example, the output of the second analog processor 1102B can be the result of an elementwise scaling operation. For example, where the output from the first analog processor 1102A is $\{(x_0*w_0), (x_1*w_1), \ldots, (x_N*w_N)\}$ and the parameters are $\{p_0, p_1, \ldots, p_n\}$, the output of the analog processor 1102B performing a scaling operation is {(p₀*x₀*w₀), (p₁*x₁*w₁), ..., (p_N*x_N*w_N)}. In another example, the analog processor 1102B can perform a dot product on the analog inputs. However, performing a dot product with the example in FIG. 11 is limited relative to the example of FIG. 10A due to a relatively smaller number of values being available for the dot product computation. Note that although two CIM compute blocks are illustrated in FIG. 11, more than two compute blocks can be cascaded. For example, an additional analog processor can receive the analog output of the second analog processor 1102B and perform another analog operation.

Figure 12:
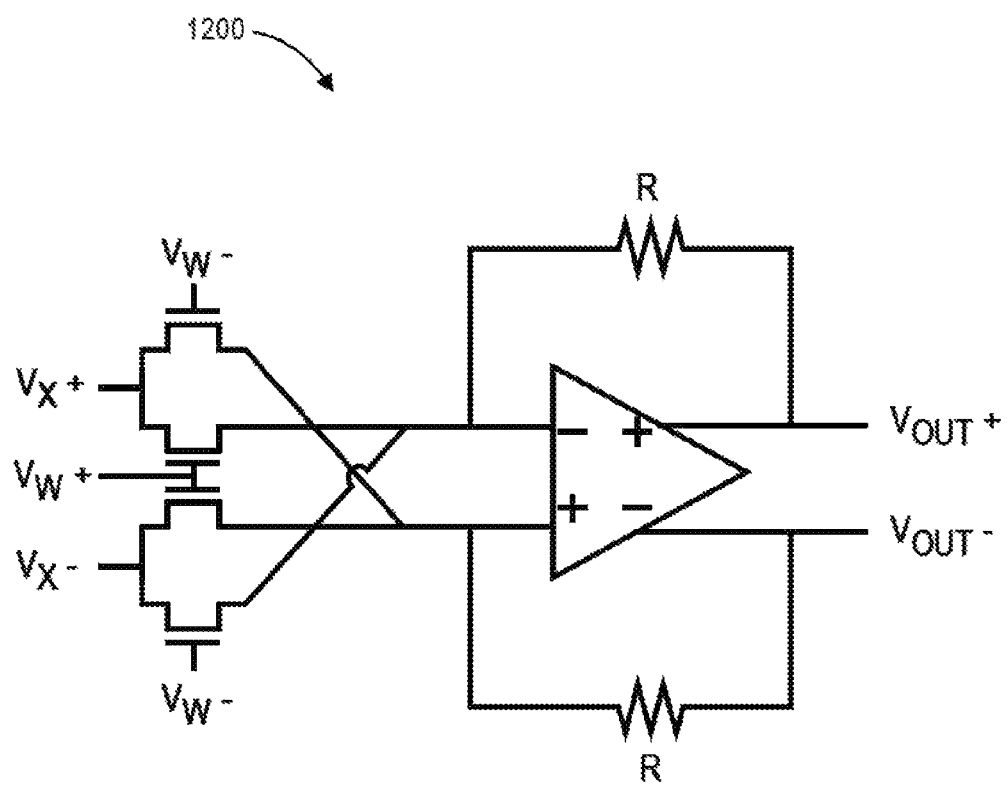
FIG. 12 illustrates a potentiometric mixer for multiplying two analog voltages.

As mentioned above, analog processors in the above examples (e.g., the analog processor 806 of FIG. 8) include analog multipliers. One example of an analog-analog multiplier is illustrated in FIG. 12. FIG. 12 illustrates an analog multiplier for multiplying two analog voltages. The multiplier 1200 of FIG. 12 is an example of a potentiometric mixer. The circuit 1200 takes two analog inputs (VW, VX) and computes the product as an analog voltage. The equations for the output voltage are as follows, where R is the value of the feedback resistors and K is a fixed constant that comes from the MOSFET equations:

$$VOUT = RKVxVw \qquad (1)$$

In the illustrated example, for the circuit 1200 to operate correctly, the common mode of the analog inputs (VW, VX) is set such that the four transistors in the left side of the circuit 1200 are operating in the triode region. Similarly, in this example, the voltage swing of the analog inputs should be sufficiently small to keep the four transistors in the triode region. FIG. 12 illustrates just one example of an analog-analog multiplier; the analog processors described herein can be one, two, or four quadrant multipliers, quarter-square multipliers, BJT multipliers, Gilbert Cell multipliers, CMOS multipliers, potentiometric mixers, and/or any other suitable analog multipliers.

FIGS. 13 and 14 illustrate examples of SRAM cells that can be used in the CIM devices described herein (e.g., the bitcells 302 of FIG. 3 and the bitcells 404 of FIG. 4). FIG. 13 is an example of an 8 transistor (8T) SRAM cell 1300. Each transistor of the SRAM cell may be a metal-oxide-semiconductor field-effect transistor (MOSFET). Transistors T1, T2, T5 and T6 are N-channel MOSFET (NMOS) transistors and transistors T3, T4, T7 and T8 are P-channel MOSFET (PMOS) transistors. Each bit in the 8T SRAM cell 1300 is stored in a storage cell comprising four transistors (T1, T2, T3, T4) that form two cross-coupled inverters. The storage cell has two stable states which are used to store a logic 0 or logic 1.

Four additional access transistors T5, T6, T7 and T8 control access to the storage cell during read and write operations. The access transistors T5 and T6 are turned on whenever a write word line (WWL) is activated for a write operation, connecting the 8T SRAM cell 1300 to the complementary write bit lines (WBL, WBL #). When the word line is not activated, the access transistors T5 and T6 are turned off and the data is retained in the storage cell while power is applied to the 8T SRAM cell 1300.

The read noise margin of the 8T SRAM cell 1300 is enhanced by isolating the read and write operation. Transistors T7, T8 provide a separate channel for reading the stored data from the storage cell by activating a read word line (RWL) to turn on transistor T7 to connect the storage cell to a single ended read bit line (RBL) (local bit line (LBL)).

FIG. 14 is an example of a six transistor (6T) SRAM cell 1400. Each transistor may be a metal-oxide-semiconductor field-effect transistor (MOSFET). Transistors T1 and T2 are P-channel MOSFET (NMOS) transistors and transistors T3, T4, T5 and T6 are N-channel MOSFET (PMOS) transistors. Each bit in the 6T SRAM cell 1400 is stored in a storage cell comprising four transistors (T1, T2, T3, T4) that form two cross-coupled inverters. The storage cell has two stable states which are used to store a logic 0 or logic 1.

Two additional access transistors T5 and T6 control access to the storage cell during read and write operations. The access transistors T5 and T6 are turned on whenever a word line (WL) is activated for read or write operation, connecting the storage cell to the complementary bit lines (BL, BL #). When the word line is not activated, the access transistors T5 and T6 are turned off and the data is retained in the storage cell while power is applied to the 6T SRAM cell 1400.

In an example that includes the 6T SRAM cell 1400, a sense amplifier (not shown) converts the local bit line voltage to a full-swing signal. The 6T SRAM cell 1400 incurs an area trade-off and may be less area efficient than 8T SRAM cell 1400 depending on the array size and process technology. In other examples, an SRAM cell may have 10, 12 or more transistors per memory cell (bit).

Figure 15:
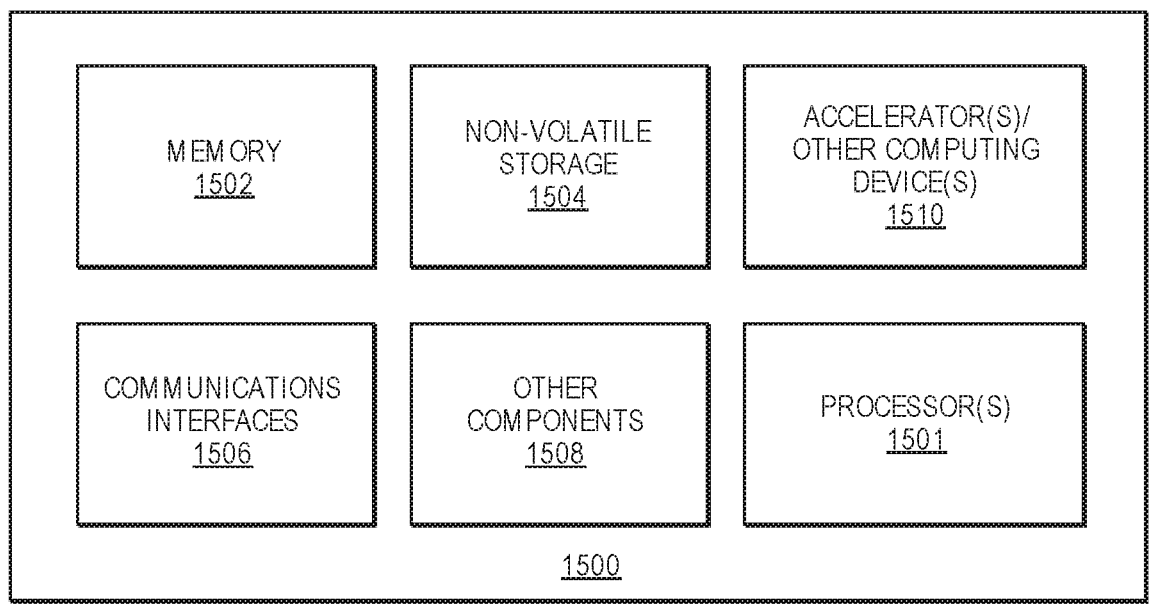
FIG. 15 provides an exemplary depiction of a computing system that can include a CIM device such as a multi-Vdd CIM device, a CIM computing device with a true analog-to-analog multiplier, or both.

FIG. 15 provides an exemplary depiction of a computing system 1500 (e.g., a smartphone, a tablet computer, a laptop computer, a desktop computer, a server computer, etc.) that can include a CIM such as a multi-Vdd CIM, a CIM computing device with a true analog-to-analog multiplier, or both. As observed in FIG. 15, the system 1500 may include one or more processors or processing units 1501 (e.g., host processor(s)). The processor(s) 1501 may include one or more central processing units (CPUs), each of which may include, e.g., a plurality of general purpose processing cores. The processor(s) 1501 may also or alternatively include one or more graphics processing units (GPUs) or other processing units. The processor(s) 1501 may include memory management logic (e.g., a memory controller) and I/O control logic. The processor(s) 1501 can be similar to or the same as the digital processors referred to herein (e.g., the digital processor 1004 of FIG. 10A). The processor(s) 1501 can include cache on a same package or near the processor. In one example, cache includes a CIM array and circuitry to perform analog computations in accordance with examples described herein.

The system 1500 also includes memory 1502 (e.g., system memory). The system memory can be in the same package (e.g., same SoC) or separate from the processor(s) 1501. In one example, the memory 1502 includes compute-in-memory (CIM) in accordance with examples described herein. In one such example, the CIM includes analog processing circuitry in addition to an array of memory cells. The system 1500 can include static random access memory (SRAM), dynamic random access memory (DRAM), or both. In one example, the memory 1502 includes a byte addressable Dynamic Random Access Memory (DRAM) or a byte addressable non-volatile memory such as a byte-addressable write-in-place three dimensional crosspoint memory device, or other byte addressable write-in-place non-volatile memory devices (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB- RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

The system 1500 also includes communications interfaces 1506 and other components 1508. The other components may include, for example, a display (e.g., touchscreen, flat-panel), a power supply (e.g., a battery or/or other power supply), sensors, power management logic, or other components. The communications interfaces 1506 may include logic and/or features to support a communication interface. For these examples, communications interface 1506 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more Ethernet standards promulgated by IEEE. For example, one such Ethernet standard may include IEEE 802.3. Network communication may also occur according to one or more OpenFlow specifications such as the OpenFlow Switch Specification. Other examples of communications interfaces include, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system 1500 also includes non-volatile storage 1504, which may be the mass storage component of the system. Non-volatile types of memory may include byte or block addressable non-volatile memory such as, but not limited to, multi-threshold level NAND flash memory, NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), 3-dimensional (3D) cross-point memory structure that includes chalcogenide phase change material (e.g., chalcogenide glass) hereinafter referred to as "3D cross-point memory", or a combination of any of the above. In one example, the non-volatile storage 1504 may also include analog processing circuitry to perform analog computations in memory in accordance with examples described herein.

The computing system 1500 may also include one or more accelerators or other computing devices 1510. For example, the computing system 1500 may include an Artificial Intelligence (AI) or machine learning accelerator optimized for performing operations for machine learning algorithms, a graphics accelerator (e.g., GPU), or other type of accelerator. An accelerator can include processing circuitry (analog, digital, or both) and may also include memory within the same package as the accelerator 1510. In one example, the accelerator 1510 includes two or more memory arrays (such as the memory arrays in FIG. 3, 4, 5, 8, 9, 10, or 11, for example). The memory arrays can be, for example, multi-Vdd arrays, such as described with respect to FIGS. 3-5. In one such example, the accelerator also includes an analog processor (such as the analog processor 503 of FIG. 5 or the analog processor 806 of FIG. 8, for example) to receive analog inputs from the memory arrays and perform analog operations. In one such example, the analog processor includes analog-analog multipliers to perform operations on the analog inputs from the multiple memory arrays.

Examples of compute-in memory circuits follow. In one example, a memory device including an array of memory cells. The array includes multiple sub-arrays, each of the sub-arrays to receive a different voltage. The device includes capacitors coupled with conductive access lines of each of the multiple sub-arrays, and circuitry coupled with the capacitors, the circuitry to share charge between the capacitors in response to a signal. In one example, the circuitry includes a switch between capacitors, the switch to be open to let the capacitors sample the voltage of access lines they are connected to prior to charge sharing, and to be closed to share charge between the capacitors. In one example, the circuitry includes a multiply-and-accumulate (MAC) circuit to multiply an input by the voltages sampled at the capacitors after charge sharing. In one example, the MAC circuit includes circuitry to perform an elementwise multiplication of the input and the voltages sampled at the capacitors after charge sharing, and sum voltage outputs of the elementwise multiplication. In one example, the input includes a digital input. In one example, the input includes an analog input.

In one example, a separate voltage generator circuit coupled with each of the multiple sub-arrays, the separate voltage generator circuit to receive a supply voltage, generate an array voltage, and supply the array voltage to the conductive access lines of a sub-array. In one example, each of the multiple sub-arrays is to receive a separate voltage level generated external to the array, the separate voltage level to be supplied to the conductive access lines of the sub-array. In one example, one of the sub-arrays is to receive the supply voltage and the remaining sub-arrays are to receive a voltage that has a magnitude that is less than the supply voltage. In one such example, at least one of the sub-arrays is to receive a voltage having a magnitude that is greater than the supply voltage. In one example, all of the sub-arrays are to receive a voltage having a magnitude that is less than the supply voltage. In one example, all of the sub-arrays are to receive a voltage having a magnitude that is greater than the supply voltage.

In one example, the array of memory cells is to store weights and a number of the sub-arrays is equal to a number of bit positions of the weights. In one example, a separate row decode circuit for each of the sub-arrays. In one example, a shared row decode circuit for multiple sub-arrays. In one example, the conductive access lines include bitlines and a read operation is to cause activation of a wordline of each of the sub-arrays and application of a different voltage to the bitlines of each of the sub-arrays. In one example, the memory device further includes a register to store a value to indicate voltages to be applied to the sub-arrays. In one example, the array includes one or more of: SRAM cells, DRAM cells, registers, resistive RAMs, magnetic RAMs, phase-change RAMs, 3D stacked memory technologies, or flash-type memory cells.

In one example, a computing device includes a first memory array, a second memory array, and an analog processor circuit coupled with the first and second memory arrays. The analog processor circuit is to receive first analog input voltages from the first memory array and second analog input voltages from the second memory array, perform one or more operations on the first and second analog input voltages and output an analog output voltage. In one example, the analog processor circuit includes a plurality of analog multiplier circuits coupled with the first and second memory arrays, each of the plurality of analog multiplier circuits to multiply an analog voltage input from the first memory array with an analog voltage input from the second memory array. The analog processor circuit also includes an analog accumulation circuit coupled with the plurality of analog multiplier circuits, the analog accumulation circuit to sum analog voltages output by the plurality of analog multiplier circuits. In one example, the analog accumulation circuit includes a charge sharing circuit.

In one example, the computing device further includes a third memory array to store outputs from the analog processor circuit, a fourth memory array, and a second analog processor circuit coupled with the third and fourth memory arrays, the second analog processor circuit to: receive third analog input voltages from the third memory array and fourth analog input voltages from the fourth memory array, perform one or more operations on the third and fourth analog input voltages, and output a second analog output voltage. In one example, the computing device includes an analog-to-digital converter (ADC) coupled with the analog processor circuit, the ADC to receive the analog output voltage from the analog processor circuit and store digital outputs in the third memory array. In one example, the computing device further includes a digital processor circuit coupled with the ADC, the digital processor circuit to receive the digital outputs of the ADC and store the digital outputs in the third memory array. In one example, the computing device further includes a second analog processor circuit coupled with the analog processor circuit, the second analog processor circuit to receive the analog output from the analog processor circuit, perform one or more operations on the analog output, and output a second analog output. In one example, the plurality of analog multiplier circuits includes one or more of: one, two, or four quadrant multipliers, quarter-square multipliers, BJT (bipolar junction transistor) multipliers, Gilbert Cell multipliers, CMOS multipliers, and potentiometric mixers.

In one example, a system includes an array of memory cells, the array including multiple sub-arrays, each of the sub-arrays to receive a different voltage, capacitors coupled with conductive access lines of each of the multiple sub-arrays, an analog processor circuit coupled with the array of memory cells via capacitors, and circuitry to share charge between the capacitors in response to a signal. In one example, the system further includes a second memory array coupled with the analog processor circuit, wherein the analog processor circuit is to: receive first analog input voltages from the memory array and second analog input voltages from the second memory array, perform one or more operations on the first and second analog input voltages, and output an analog output voltage.

Thus, compute-in memory (CIM) includes both data storage and circuitry for performing dot product computations for deep learning and other machine learning algorithms. CIMs can implement a multi-Vdd approach as described above to reduce power consumption and increase bandwidth, as well as reduce the number of ADCs used. Also, processing with both operands (e.g., weights and inputs) expressed as analog voltages can be achieved using a low energy true analog multiplier. The use of the true analog multiplier reduces the number of ADCs required to implement the CIM by performing computation in the analog domain. Therefore, both the input activation and weight operand for deep learning can be read using a multi-bit per column functional read with higher bandwidth and less data movement than a traditional read. Note that although machine learning examples are used, the CIMs described herein may also be used for applications other than machine learning.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

Flow diagrams as illustrated herein provide examples of sequences of various process actions. The flow diagrams can indicate operations to be executed by a software or firmware routine, as well as physical operations. In one example, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various examples; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine-readable storage medium can cause a machine to perform the functions or operations described and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Terms used above to describe the orientation and position of features such as 'top', 'bottom', 'over', 'under', and other such terms describing position are intended to clarify the relative location of features relative to other features, and do not describe a fixed or absolute position. For example, a wafer that is described as the top wafer that is above or over a bottom wafer could be described as a bottom wafer that is under or below a top wafer. Therefore, the illustrations and examples herein should be construed in an illustrative, and not a restrictive sense. The scope of the invention should be measured solely by reference to the claims that follow.

What is claimed is:

1. A memory device comprising:
an array of memory cells, the array including multiple sub-arrays, each of the sub-arrays to receive a different voltage;
capacitors coupled with conductive access lines of each of the multiple sub-arrays; and
circuitry coupled with the capacitors, the circuitry including multiple switches, each of the multiple switches coupled with one of the capacitors, the switches to be open to let the capacitors sample the voltage of the conductive access lines they are connected to prior to charge sharing, and to be closed to share charge between the capacitors.

2. The memory device of claim 1, wherein:
the circuitry includes a multiply-and-accumulate (MAC) circuit to multiply an input by the voltages sampled at the capacitors after charge sharing.

3. The memory device of claim 2, wherein:
the MAC circuit includes circuitry to:
perform an elementwise multiplication of the input and the voltages sampled at the capacitors after charge sharing, and
sum voltage outputs of the elementwise multiplication.

4. The memory device of claim 2, wherein:
the input includes a digital input.

5. The memory device of claim 2, wherein:
the input includes an analog input.

6. The memory device of claim 1, further comprising:
a separate voltage generator circuit coupled with each of the multiple sub-arrays, the separate voltage generator circuit to receive a supply voltage, generate an array voltage, and supply the array voltage to the conductive access lines of a sub-array.

7. The memory device of claim 6, wherein:
one of the sub-arrays is to receive the supply voltage and the remaining sub-arrays are to receive a voltage that has a magnitude that is less than the supply voltage.

8. The memory device of claim 6, wherein:
at least one of the sub-arrays is to receive a voltage having a magnitude that is greater than the supply voltage.

9. The memory device of claim 6, wherein:
all of the sub-arrays are to receive a voltage having a magnitude that is less than the supply voltage.

10. The memory device of claim 6, wherein:
all of the sub-arrays are to receive a voltage having a magnitude that is greater than the supply voltage.

11. The memory device of claim 1, wherein:
each of the multiple sub-arrays is to receive a separate voltage level generated external to the array, the separate voltage level to be supplied to the conductive access lines of the sub-array.

12. The memory device of claim 1, wherein:
the array of memory cells is to store weights; and
a number of the sub-arrays is equal to a number of bit positions of the weights.

13. The memory device of claim 1, including:
a separate row decode circuit for each of the sub-arrays.

14. The memory device of claim 1, including:
a shared row decode circuit for multiple sub-arrays.

15. The memory device of claim 1, wherein:
the conductive access lines include bitlines; and
a read operation is to cause activation of a wordline of each of the sub-arrays and application of a different voltage to the bitlines of each of the sub-arrays.

16. The memory device of claim 1, further including:
a register to store a value to indicate voltages to be applied to the sub-arrays.

17. The memory device of claim 1, wherein:
the array includes one or more of: SRAM cells, DRAM cells, registers, resistive RAMs, magnetic RAMs, phase-change RAMs, 3D stacked memory technologies, or flash-type memory cells.

18. A computing device comprising:
a first memory array;
a second memory array; and
an analog processor circuit coupled with the first and second memory arrays, the analog processor circuit including:
circuitry to receive first analog input voltages from the first memory array and second analog input voltages from the second memory array,
a plurality of analog multiplier circuits coupled with the first memory array and the second memory array, each of the plurality of analog multiplier circuits to multiply an analog input voltage from the first memory array with an analog input voltage from the second memory array,
an analog accumulation circuit coupled with the plurality of analog multiplier circuits, the analog accumulation circuit to sum analog voltages output by the plurality of analog multiplier circuits, and
output an analog output voltage.

19. The computing device of claim 18, wherein:
the analog accumulation circuit includes a charge sharing circuit.

20. The computing device of claim 18, further comprising:
a third memory array to store outputs from the analog processor circuit;
a fourth memory array; and
a second analog processor circuit coupled with the third and fourth memory arrays, the second analog processor circuit to:

receive third analog input voltages from the third memory array and fourth analog input voltages from the fourth memory array, perform one or more operations on the third and fourth analog input voltages, and output a second analog output voltage.

21. The computing device of claim 20, further comprising:

an analog-to-digital converter (ADC) coupled with the analog processor circuit, the ADC to receive the analog output voltage from the analog processor circuit and store digital outputs in the third memory array.

22. The computing device of claim 21, further comprising:

a digital processor circuit coupled with the ADC, the digital processor circuit to receive the digital outputs of the ADC and store the digital outputs in the third memory array.

23. The computing device of claim 18, further comprising:

a second analog processor circuit coupled with the analog processor circuit, the second analog processor circuit to receive the analog output voltage from the analog processor circuit, perform one or more operations on the analog output voltage, and output a second analog output.

24. The computing device of claim 18, wherein the plurality of analog multiplier circuits includes one or more of: one, two, or four quadrant multipliers, quarter-square multipliers, BJT (bipolar junction transistor) multipliers, Gilbert Cell multipliers, CMOS multipliers, and potentiometric mixers.

25. A system comprising:

an array of memory cells, the array including multiple sub-arrays, each of the sub-arrays to receive a different voltage;

a register to store a value to indicate voltages to be applied to the sub-arrays;

capacitors coupled with conductive access lines of each of the multiple sub-arrays;

an analog processor circuit coupled with the array of memory cells via the capacitors; and circuitry to share charge between the capacitors in response to a signal.

26. The system of claim 25, further comprising:

a second memory array coupled with the analog processor circuit;

wherein the analog processor circuit is to:

receive first analog input voltages from the array of memory cells and second analog input voltages from the second memory array, perform one or more operations on the first and second analog input voltages, and output an analog output voltage.

* * * * *